(12) United States Patent  (10) Patent No.: US 7,812,767 B2
Seki et al.  (45) Date of Patent: Oct. 12, 2010

(54) ANTENNA DEVICE, ARRAY ANTENNA DEVICE USING THE ANTENNA DEVICE, MODULE, MODULE ARRAY AND PACKAGE MODULE

(75) Inventors: Tomohiro Seki, Yokohama (JP); Kenjiro Nishikawa, Yokohama (JP); Naoki Honma, Yokosuka (JP); Kouichi Tsunekawa, Yokohama (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 826 days.

(21) Appl. No.: 11/660,621

(22) PCT Filed: Sep. 7, 2005

(86) PCT No.: PCT/JP2005/016424

§ 371 (c)(1),
(2), (4) Date: Mar. 2, 2007

(87) PCT Pub. No.: WO2006/028136

PCT Pub. Date: Mar. 16, 2006

(65) Prior Publication Data

US 2008/0042917 A1 Feb. 21, 2008

(30) Foreign Application Priority Data

Sep. 7, 2004 (JP) ............................ 2004-260038
Jun. 17, 2005 (JP) ............................ 2005-178001

(51) Int. Cl.
*H01Q 1/38* (2006.01)
*H01Q 13/06* (2006.01)
*H01Q 15/14* (2006.01)

(52) U.S. Cl. .............................. 343/700 MS; 343/778; 343/786; 343/837

(58) Field of Classification Search .......... 343/700 MS, 343/702, 778, 786, 834, 837
See application file for complete search history.

(56) References Cited

U.S. PATENT DOCUMENTS 3,665,480 A * 5/1972 Fassett ....................... 343/754
4,347,517 A 8/1982 Kaloi (Continued)

FOREIGN PATENT DOCUMENTS

JP H08-125432 5/1996

(Continued)

OTHER PUBLICATIONS

Tomohiro Seki et al., "Reflector Antenna Using Multi-Layer HTCC Substrate", IEICE Communications Society Conference, p. 95, Sep. 8, 2004.

(Continued)

*Primary Examiner*—Michael C Wimer
(74) *Attorney, Agent, or Firm*—Harness, Dickey & Pierce, P.L.C.

(57) ABSTRACT

A small antenna device having an increased gain is provided. The antenna device includes a multilayer dielectric substrate composed of a combination of a plurality of dielectric layers, wherein a feeding antenna is provided in a lower layer of the multilayer substrate, a reflective metal plate is provided above the feeding antenna, and circular or rectangular metal loops are arranged so as to be of increasing diameter from lower layers toward upper layers in the plurality of dielectric layers.

19 Claims, 24 Drawing Sheets

U.S. PATENT DOCUMENTS 6,064,350 A    5/2000  Uchimura et al.

FOREIGN PATENT DOCUMENTS

| JP | H10-135713 | 5/1998 |
|----|------------|--------|
| JP | 10-242745  | 9/1998 |
| JP | H11-046114 | 2/1999 |
| JP | H11-168320 | 6/1999 |
| JP | 3026171    | 1/2000 |
| JP | 2000-261235 | 9/2000 |
| JP | 2001-102861 | 4/2001 |
| JP | 2001-185916 | 7/2001 |
| JP | 2001-326319 | 11/2001 |
| JP | 2002-016427 | 1/2002 |
| JP | 2002-084126 | 3/2002 |
| JP | 2002-271133 | 9/2002 |
| JP | 3420474    | 4/2003 |

OTHER PUBLICATIONS

Seki, Tomohiro, et al., "Novel Microstrip Antenna Employing Stacked Rings on Multi-Layer Ceramic Substrate for mm-Wave Applications," 2005 IEEE MTT-S International Microwave Symposium, Piscataway, NJ, USA, IEEE, Jun. 12, 2005, pp. 1405-1408, XP010844897, ISBN: 978-0-7803-8846-8.

* cited by examiner

ANTENNA DEVICE, ARRAY ANTENNA DEVICE USING THE ANTENNA DEVICE, MODULE, MODULE ARRAY AND PACKAGE MODULE

TECHNICAL FIELD

The present invention relates to antenna devices which are used for achieving higher-gain antennas using chip antennas and the like, and which, in particular, are able to effectively achieve a higher gain when actually building system-on-packages that integrate active devices with antennas.

Priority is claimed on Japanese Patent Application No. 2004-260038 filed on Sep. 7, 2004 and Japanese Patent Application No. 2005-178001 filed on Jun. 17, 2005, the contents of which are incorporated herein by reference.

BACKGROUND ART

A variety of constructions have hitherto been proposed for increasing the gain of single-element antennas. FIGS. 30A and 30B shows an example of the structure of a microstrip antenna having a metal wall, which is one construction that has been investigated as a way of increasing the gain of single-element antennas (see Patent Document 1). FIGS. 30A and 30B are respectively perspective and cross-sectional views showing the construction of a conventional antenna device. In FIGS. 30A and 30B, 15 denotes a cylinder, 16 denotes a microstrip patch, 17 denotes a feeding point, 18 denotes a substrate, 19 denotes a ground plate, 20 denotes a substrate for feeding circuit, and 21 denotes a feeding circuit.

The scheme is shown which increases the gain of a microstrip antenna by providing a cylinder 15, being a metal wall, as the basic configuration. Specifically, the construction here is one in which a cylinder 15 made of metal is placed around a microstrip antenna composed of a substrate 18, a microstrip patch 16 formed on the substrate 18, and a ground plate 19 provided on the back surface of the substrate 18. The cylinder 15 is grounded to the ground plate 19 of the microstrip antenna.

Patent Document 1: Japanese Patent No. 3026171

DISCLOSURE OF INVENTION

Problems to be Solved by the Invention

However, in Patent Document 1, an increase in gain on the order of only about 10 dBi is exhibited; a further increase in the gain of microstrip antennas using a single element is not shown.

The present invention has focused on the fact that in communications systems that use the millimeter wave frequency band, loss due to the connection interface between an antenna and other RF circuits is not negligible, and the effectiveness of integrating the RF circuits with the antenna in reducing such loss.

The present invention was made in light of the above circumstances. An object of the present invention is to provide antenna devices which, by integrating a substrate having a built-in RF circuit with an antenna substrate, and by incorporating a surface antenna in the form of a chip, achieve both a small size and a higher gain. Another object of the present invention is to provide array antenna devices, modules, module arrays and package modules which use such high-gain antenna devices.

Means for Solving the Problems

To achieve the above objects, the antenna device of the present invention comprises: a multilayer dielectric substrate composed of a combination of a plurality of dielectric layers; a feeding antenna provided in a lower layer of the multilayer dielectric substrate; a metal plate provided above the feeding antenna; and circular or rectangular metal loops arranged in the plurality of dielectric layers so as to be of increasing diameter from lower layers toward upper layers.

In the antenna device in accordance with the present invention, the metal plate may function as a primary reflector and the metal loops may function as secondary reflectors.

Moreover, in the antenna device in accordance with the present invention, a circular or rectangular slot may be formed in the metal plate.

Moreover, the antenna device in accordance with the present invention may further comprise a planar antenna provided on a bottom surface of the metal plate, and the planar antenna may have a stub on a surface of the planar antenna.

Moreover, in the antenna device in accordance with the present invention, the planar antenna may comprise a variable capacitance element as an element.

Moreover, in the antenna device in accordance with the present invention, a plurality sets of the metal loops which function as secondary reflectors corresponding to a plurality of frequencies may be arranged in the plurality of dielectric layers.

Moreover, the antenna device in accordance with the present invention may further comprise a MEMS device which functions as a reflector on a back surface of the metal plate.

Moreover, in the antenna device in accordance with the present invention, the feeding antenna may be constructed of a single feeding element, a single feeding element in combination with one or more parasitic element, a plurality of feeding elements, or a plurality of element groups each having a single feeding element and one or more parasitic element.

Moreover, in the antenna device in accordance with the present invention, the metal plate may function as a parasitic element and the metal loops may function as reflectors.

Moreover, in the antenna device in accordance with the present invention, the shape of the metal plate may be a circle or a rectangle, with the diameter of the circle or the length of any one side of the rectangle being in a range of from 1.48 times to 2.16 times the wavelength in a dielectric of the multilayer dielectric substrate.

Moreover, in the antenna device in accordance with the present invention, the shape of the metal plate may be a circle or a rectangle, with the diameter of the circle or the length of any one side of the rectangle being in a range of from 1.62 times to 1.86 times the wavelength in a dielectric of the multilayer dielectric substrate.

Moreover, in the antenna device in accordance with the present invention, the metal plate may be made of a metal that is driven in a fifth or higher order odd mode.

Moreover, in the antenna device in accordance with the present invention, the metal plate may have a height from the bottommost dielectric layer in a range of from 0.12 to 0.28 times the wavelength in a dielectric of the multilayer dielectric substrate.

Moreover, in the antenna device in accordance with the present invention, the metal plate may have a height from the bottommost dielectric layer in a range of from 0.16 to 0.22 times the wavelength in a dielectric of the multilayer dielectric substrate.

Moreover, in the antenna device in accordance with the present invention, the metal loops may have a construction in which a sector having an arbitrary angle has been removed from an overall circumference.

Moreover, in the antenna device in accordance with the present invention, the metal loops arranged in respective layers of the plurality of dielectric layers may be connected by through holes or via holes.

Moreover, in the antenna device in accordance with the present invention, the metal plate may be a microstrip antenna which resonates at a second frequency and is driven at the second frequency independent of the feeding antenna which is driven at a first frequency.

Moreover, a module in accordance with the present invention comprises: the antenna device in accordance with the present invention; and an active device mounted on a surface of the antenna device.

Moreover, a module array in accordance with the present invention comprises a plurality of modules in accordance with the present invention.

Moreover, a package module in accordance with the present invention comprises: the antenna device in accordance with the present invention; an active device mounted on a surface of the antenna device; and a substrate having a cavity structure and being connected to the antenna device on a side of the surface.

Moreover, an array antenna device in accordance with the present invention comprises a plurality of antenna devices in accordance with the present invention.

ADVANTAGEOUS EFFECTS OF THE INVENTION

The antenna device in accordance with the present invention includes a multilayer dielectric substrate composed of a plurality of dielectric layers, a feeding antenna provided in a lower layer of the multilayer dielectric substrate, a metal plate provided above the feeding antenna, and circular or rectangular metal loops arranged so as to be of increasing diameter from lower layers toward upper layers in the plurality of dielectric layers.

The antenna device can thus be made to operate in the same way as a reflection-type aperture antenna, enabling a surface antenna of simple construction to be achieved. As a result, a high-gain antenna of excellent manufacturability can be achieved.

Moreover, in the antenna device in accordance with the present invention, the metal plate has a circular or rectangular slot formed therein. Therefore, a portion of the electric power of electromagnetic waves radiated from the feeding antenna can thus be radiated directly. As a result, radiation characteristics having no notch in the main lobe can be achieved. This makes it possible to achieve a relatively small-scale, high-gain antenna.

Moreover, in the antenna device in accordance with the present invention, a planar antenna is provided on a bottom surface of the metal plate, and a stub is provided on a surface of the planar antenna.

Therefore, it is possible to adjust the driven phase by the planar antenna located on the bottom surface. As a result, the radiation characteristics of reflected waves from the primary radiator can be controlled. It is thus possible to achieve the desired radiation characteristics even using an antenna of this construction.

Moreover, in the antenna device in accordance with the present invention, the planar antenna includes as an element therein a variable capacitance element.

This enables the driven phase of the planar antenna located on the bottom surface to be variably controlled, thereby making it possible to variably control the radiation characteristics of reflected waves from the primary radiator. It is thus possible to achieve variable directivity control with an antenna of this construction.

Moreover, in the antenna device in accordance with the present invention, a plurality of the metal loops which function as secondary reflectors and correspond to a plurality of frequencies are arranged in the plurality of dielectric layers.

Therefore, the reflectors can be operated independently by frequency. As a result, different directivities can be achieved at each of a plurality of frequencies. Hence, an antenna compatible with a plurality of systems can be achieved.

Moreover, the antenna device of the present invention has a MEMS device, which functions as a reflector, that is provided on the back surface of the metal plate.

Therefore, by changing the angle of the MEMS device located on the bottom surface of the metal plate, the direction of the reflected waves can be adjusted. As a result, the radiation characteristics of the reflected waves from the primary reflector can be variably controlled. Hence, the radiation characteristics of an antenna having this construction can be variably controlled.

Moreover, in the antenna device in accordance with the present invention, the metal plate functions as a parasitic element and the metal loops function as reflectors. As a result, electromagnetic waves radiated from the feeding antenna are re-radiated by the parasitic element, in addition to which they are reflected by conductive members having an annular or other shape. Such a configuration makes it possible to achieve a high-gain antenna device.

Moreover, in the antenna device in accordance with the present invention, the diameter of a circle or the length of any one side of a rectangle of the metal plate having a circular or rectangular shape is in a range of from 1.48 times to 2.16 times the wavelength in the dielectric of the multilayer dielectric substrate. This enables a high gain of 10 dBi or more to be achieved.

Moreover, in the antenna device in accordance with the present invention, the diameter of a circle or the length of any one side of a rectangle of the metal plate having a circular or rectangular shape is in a range of from 1.62 times to 1.86 times the wavelength in the dielectric of the multilayer dielectric substrate. This enables a high gain of 15 dBi or more to be achieved.

Moreover, in the antenna device in accordance with the present invention, the metal plate is made of a metal that is driven in a fifth or higher order odd mode. As a result, in addition to a parasitic element which is driven in a third mode, even with the use of a parasitic element which is driven in a fifth or higher order odd mode, a high gain similar to that of a parasitic element which is driven in a third order mode can be achieved.

Moreover, in the antenna device of the present invention, the metal plate has a height in a range of from 0.12 to 0.28 times the wavelength in the dielectric of the multilayer dielectric substrate. This enables a high gain of 10 dBi or more to be achieved.

Moreover, in the antenna device of the present invention, the metal plate has a height in a range of from 0.16 to 0.22 times the wavelength in the dielectric of the multilayer dielectric substrate. This enables a high gain of 15 dBi or more to be achieved.

Moreover, in the antenna device in accordance with the present invention, the metal loops have a construction in which an arbitrary angle has been cut from the overall circumference. The antenna thus has an aperture in one place only. As a result, an aperture can be formed in a place apart from the feeding point. Hence, it is possible to provide a configuration in which the feeding point and the aperture position are away from each other.

Furthermore, in the antenna device in accordance with the present invention, metal loops situated in respective layers of the plurality of dielectric layers are connected therebetween by through holes or via holes.

Therefore, the electric potentials of the respective metal loops can be made uniform. As a result, the operation of the metal loops as reflecting surfaces can be stabilized. Hence, it is possible to minimize disturbances in the radiation characteristics.

Moreover, in the antenna device, the metal plate is a microstrip antenna which resonates at a second frequency and is driven at the second frequency independent of the feeding antenna which is driven at a first frequency.

Therefore, it is possible to have the antenna device operate as the original surface antenna at a first frequency, and operate as a single-element planar antenna at a second frequency.

As a result, narrow-beam radiation characteristics can thus be achieved in a relatively high first frequency band and broad radiation characteristics can be achieved in a relatively low second frequency band. Therefore, an antenna compatible with a plurality of systems can be obtained.

The module in accordance with the present invention is composed of the antenna device and an active device mounted on the surface of the antenna device. Therefore, a module can be provided in which the antenna device and the active device are integrated. Moreover, because the module can be mounted directly on a motherboard, for example, it is possible to dispense with the use of via holes or the like having large associated losses, thereby enabling a significant reduction in connection loss.

Moreover, the module array of the present invention is composed of a plurality of such modules. As a result, the module can be applied to applications requiring a high gain which cannot be achieved with a single module.

Moreover, the package module of the present invention is composed of an antenna device, an active device mounted on the surface of the antenna device, and a substrate having a void structure which is connected to the antenna device on the surface side thereof. As a result, the package module can be provided in a form in which the antenna device and the active device are integrated.

Moreover, the array antenna device of the present invention is composed of a plurality of antenna devices. As a result, the array antenna device can be applied to applications requiring a high gain which cannot be achieved with a single antenna device.

EXPLANATION OF REFERENCE SYMBOLS

Figure 1A:
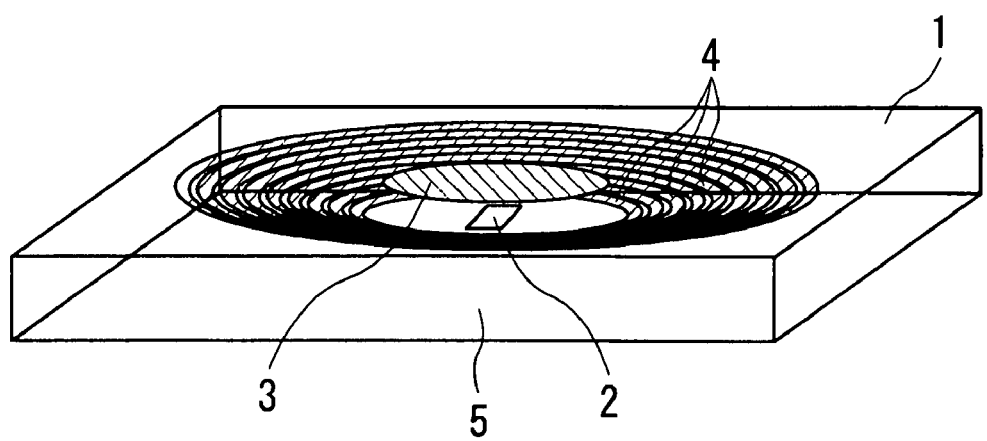
FIG. 1A is a perspective view showing the construction of an antenna device according to a first embodiment of the present invention.

1: dielectric substrate
2: microstrip antenna
3: primary reflector
4: secondary reflector
5: ground plate
6: slot
7: parasitic element
8: through hole (via hole)
9: microstrip antenna array
10: varactor diode
11: reflector for first frequency (f1)
12: reflector for second frequency (f2)
13: primary reflector for first frequency (f1) and driven element for second frequency (f2)
14: MEMS reflector
30: conductor
31: stub
101: multilayer dielectric substrate
102: microstrip antenna
103: parasitic element
103a: parasitic element
104: secondary reflector
104a: secondary reflector
105: ground plate
106: conductor plate
107: through hole (or via hole)
108: conductor
130: RF package
131: antenna device
131b: multilayer dielectric
131B: multilayer dielectric substrate
131a: secondary reflector
131c: feeding element
131d: parasitic element
132: MMIC chip
133: holding member
134 to 136: bumps
137: via hole
138: ground
140: module
150: motherboard
200: local oscillator
201: IF signal input terminal
202: antenna
203: RF circuit
204: phase shifter
205: frequency mixer
206: amplifier
220: single-element antenna
221: four-element array antenna
222: feeder line

BEST MODE FOR CARRYING OUT THE INVENTION

Embodiments of the present invention are described in detail below in conjunction with the accompanying diagrams. However, it should be understood that the present invention is not limited to the following embodiments. For example, suitable combinations of these embodiments also fall within the scope of the present invention.

First Embodiment

FIGS. 1A (perspective view) and 1B (cross-sectional view) show the construction of an antenna device according to a first embodiment of the present invention. In these diagrams, 1 denotes dielectric substrates, 2 denotes a microstrip antenna, 3 denotes a primary reflector, 4 denotes secondary reflectors, and 5 denotes a ground plate.

Figure 1B:
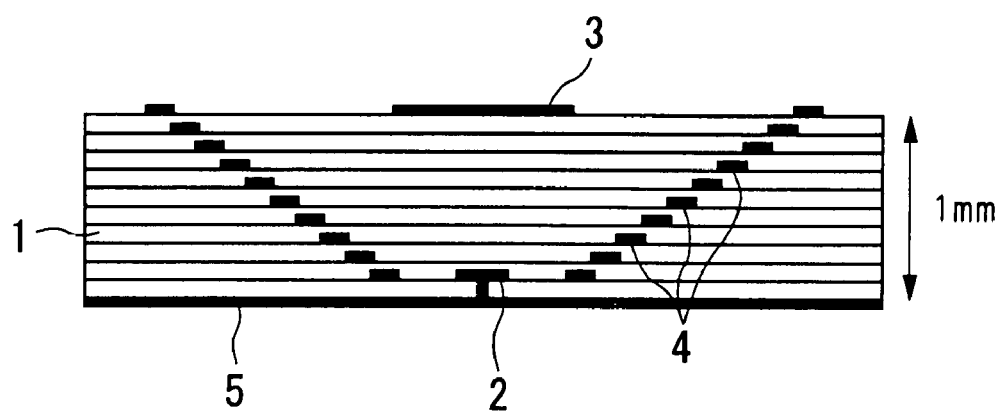
FIG. 1B is a cross-sectional view showing the construction of an antenna device according to the first embodiment of the present invention.

The antenna device shown in FIGS. 1A and 1B is composed of ten dielectric substrates 1 having a thickness per layer of 0.1 mm. In operation, a microstrip antenna 2 situated in the bottommost layer radiates electromagnetic waves which are reflected by a primary reflector 3 made of a metal plate, and are additionally reflected by secondary reflectors 4 made of circular metal loops.

In the present invention, the use of high-temperature co-fired ceramic (HTCC) substrates, etc., enables the device to be made thinner and smaller, making it possible to achieve a device thickness of about 1 mm for a 60 GHz band.

Moreover, a gain of 10 dBi or more can be achieved.

It should be noted that although the secondary reflectors 4 have been given a circular shape, the term "circular shape" as it relates in the present invention to secondary reflectors encompasses also elliptical shapes. Alternatively, the secondary reflectors 4 may have a shape that is other than circular, such as a rectangular shape including a square or elongated rectangular shape.

Second Embodiment

Figure 2A:
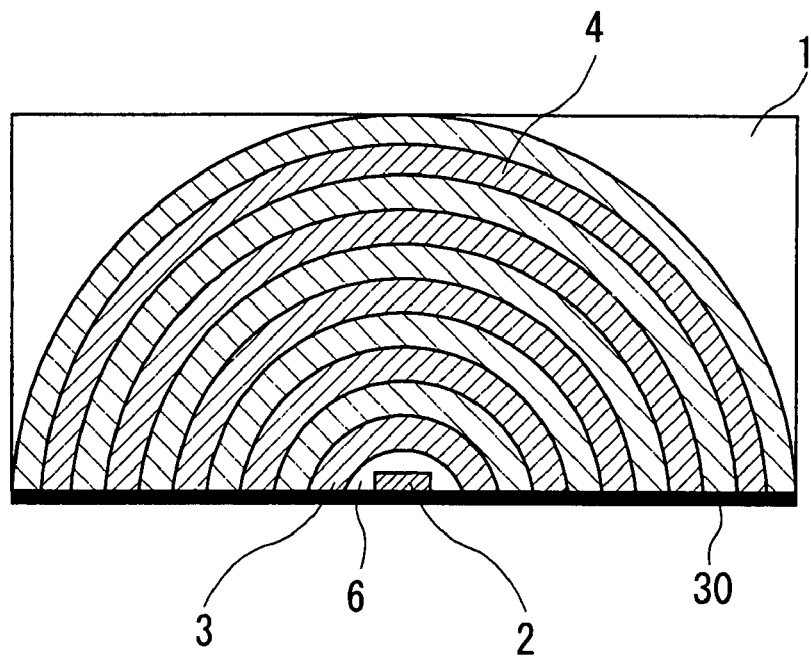
FIG. 2A is a top view showing the construction of an antenna device according to a second embodiment of the present invention.

FIGS. 2A (top view) and 2B (cross-sectional view) show the construction of an antenna device according to a second embodiment of the present invention. In these diagrams, 1 denotes dielectric substrates, 2 denotes a microstrip antenna, 3 denotes a primary reflector, 4 denotes secondary reflectors, 5 denotes a ground plate, and 6 denotes a slot.

Figure 2B:
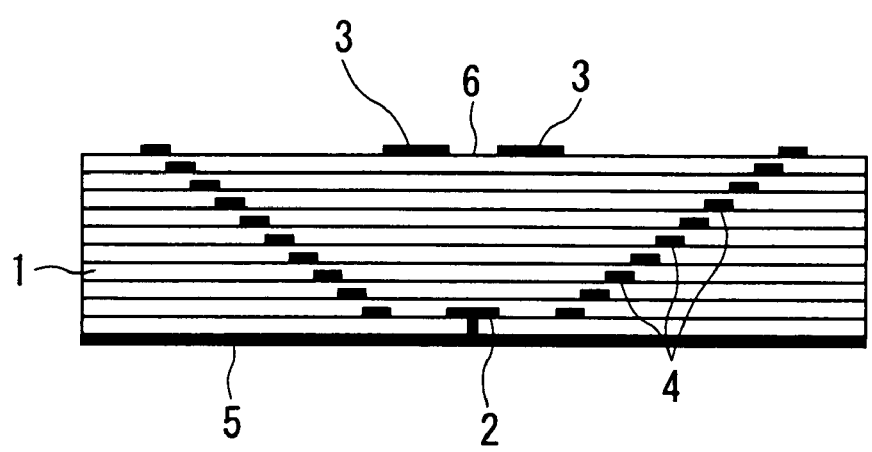
FIG. 2B is a cross-sectional view showing the construction of an antenna device according to the second embodiment of the present invention.

The antenna device according to the second embodiment shown in FIGS. 2A and 2B has a construction in which the antenna construction in the antenna device according to the first embodiment has been cut exactly in half and a conductor 30 placed at the boundary.

It should be noted that the secondary reflectors 4 may be composed of metal loops of circular (which, as noted above, encompasses elliptical) or rectangular shape in which a sector having an arbitrary angle is removed.

In this arrangement, the generation of an image due to the conductor 30 allows the area of the surface antenna to be reduced to about one-half that in the antenna device according to the first embodiment.

Moreover, because the aperture is located in one place and the feeding element moves from the center of the overall antenna construction to the edge, this arrangement, offers such advantages as suitability for connection with a circuit.

It should be noted that in the example shown in FIGS. 2A and 2B, although a slot 6 has been provided, much as in the third embodiment subsequently described, it is also possible to use a primary reflector 3 which is of the same shape as that shown in FIGS. 1A and 1B and does not have a slot. Therefore, the slot 6 is described below in detail in connection with the third embodiment.

Third Embodiment

Figure 3A:
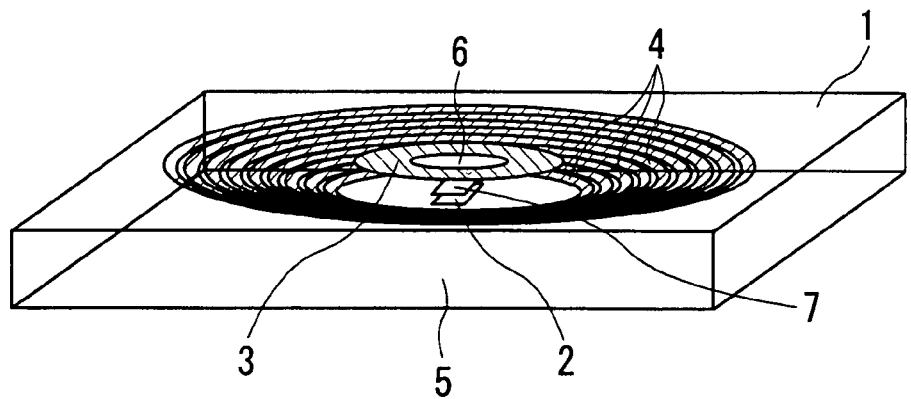
FIG. 3A is a perspective view showing the construction of an antenna device according to a third embodiment of the present invention.
Figure 3B:
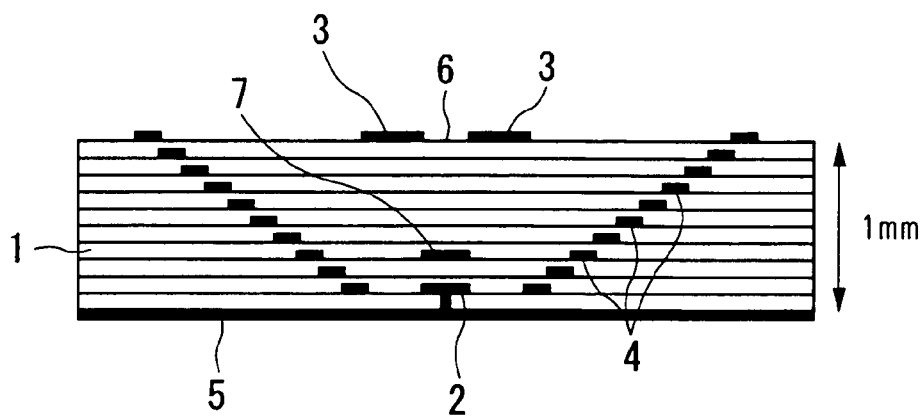
FIG. 3B is a cross-sectional view showing the construction of an antenna device according to the third embodiment of the present invention.
Figure 3C:
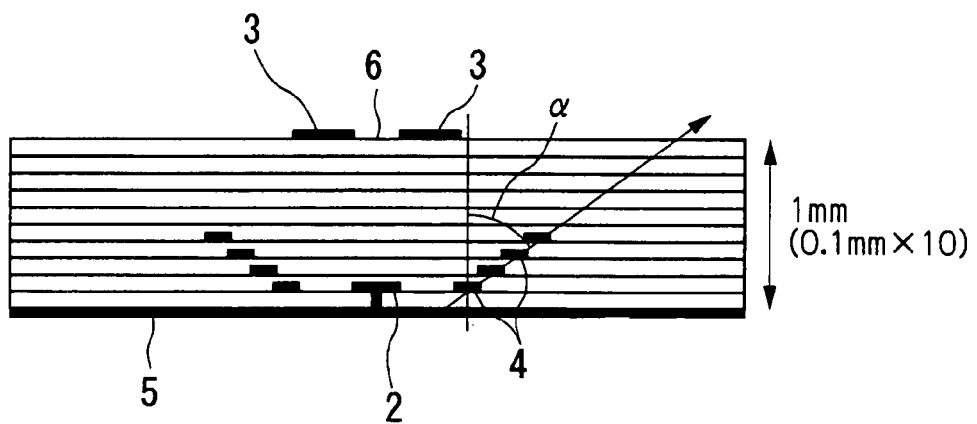
FIG. 3C is a diagram showing definitions of the arrangement of annular rings.

FIGS. 3A to 3C show the construction of an antenna device according to a third embodiment of the present invention. FIG. 3A is a perspective view showing the overall construction of the antenna device, FIG. 3B is a cross-sectional view of FIG. 3A, and FIG. 3C is a diagram showing definitions of the placement of annular rings. In the FIGS. 3A to 3C, 1 denotes dielectric substrates, 2 denotes a microstrip antenna, 3 denotes a primary reflector, 4 denotes secondary reflectors, 5 denotes a ground plate, 6 denotes a slot, and 7 denotes a parasitic element which re-radiates electromagnetic waves that have been radiated by the microstrip antenna 2.

The antenna construction in FIGS. 3A to 3C is one where, by providing within the antenna construction shown in the first embodiment (FIGS. 1A and 1B) a circular (including elliptical) or rectangular (including square or elongated rectangular) slot 6 in the primary reflector 3, the electromagnetic waves radiated by the microstrip antenna 2 are discharged directly into the space with a portion of the electromagnetic waves not being reflected. This not only reduces the influence due to electromagnetic waves reflected directly to the microstrip antenna 2 from the primary reflector 3, it is also able to suppress disruptions in the directivity within the main beam. That is, in the arrangement according to the first embodiment, a dead zone due to a null pattern is generated above the area near the center of the primary reflector 3, whereas providing a slot 6 as in the present embodiment allows the antenna to resonate, enabling the generation of such a dead zone to be prevented.

Concerning the placement of the parasitic element 7, it is conceivable to place the parasitic element 7 above the microstrip antenna 2 as shown in FIG. 3B or to place it alongside the microstrip antenna 2.

For example, viewing the microstrip antenna 2 from above the antenna device, if it is assumed that standing waves are generated in the vertical direction (that is, in the direction perpendicular to the page), an arrangement in which parasitic elements of the same shape are positioned both above and below the microstrip antenna 2 is conceivable.

Alternatively, if standing waves are generated in the same way as just described, parasitic elements may be placed on both the left and right sides of the microstrip antenna 2 such that, for example, the length in the vertical direction of the parasitic element placed on the left side is greater than the length in the vertical direction of the parasitic element placed on the right side. With such an arrangement, when the microstrip antenna 2 resonates at, for example, 60 GHz, the parasitic element placed on the left side is made to resonate at, for example, 58 GHz and the parasitic element placed on the right side is made to resonate at, for example, 62 GHz. As a result, the center position of the electric current will tend toward the direction that resonates more readily, enabling a wider bandwidth to be achieved.

Next, the microstrip antenna 2 is described. The microstrip antenna 2 may be composed of a single element as shown above, or may be composed of a plurality of elements arranged in an array. When a parasitic element 7 is provided in addition to the microstrip antenna 2, the configuration may be one in which a plurality of such elements are disposed in an array. This holds true as well for embodiments other than the present embodiment.

Figure 4A:
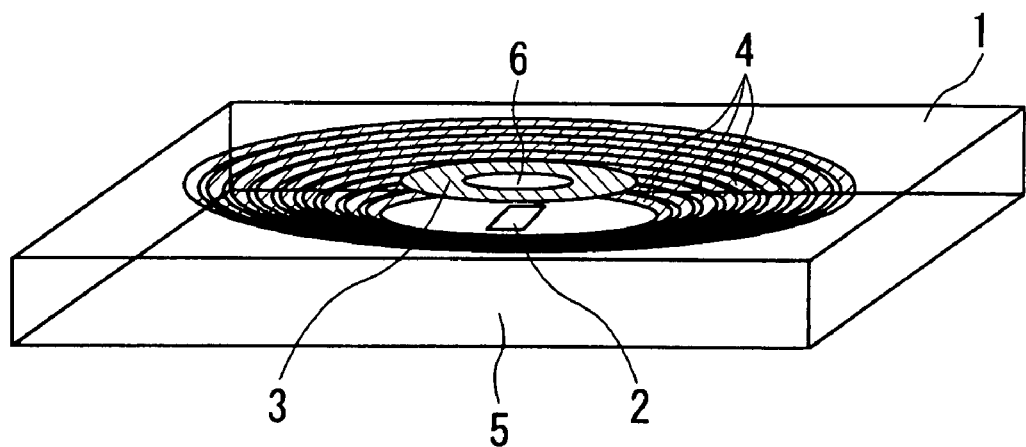
FIG. 4A is a perspective view showing the construction of the antenna device in FIG. 3A with a parasitic element 7 omitted.
Figure 4B:
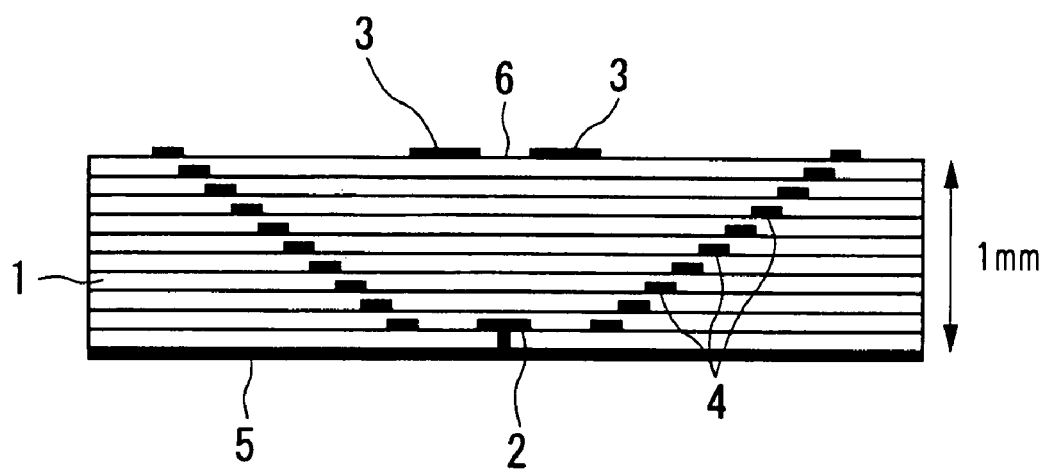
FIG. 4B is a cross-sectional view showing the construction of the antenna device in FIG. 3B with the parasitic element 7 omitted.

It should be noted that FIGS. 3A and 3B show an arrangement in which a parasitic element 7 is provided. However, because providing a parasitic element 7 is not essential, it may be omitted. FIGS. 4A and 4B show an example of the configuration of an antenna device having just such a construction.

Moreover, the embodiments other than the present embodiment described herein include some in which a parasitic element is not provided. However, even in these latter embodiments, a parasitic element may be provided in the same way as in the present embodiment.

Next, the results of analysis by the moment method are given for examples in which it is presumed that the dielectric substrates 1 are high temperature co-fired ceramic substrates (dielectric constant, 9.0). The configuration (configuration parameters) (A) and characteristics (B) in a 60 GHZ band in which ten layers of substrate having a thickness per layer of 0.1 mm are used for a case four layers of annular metal rings are arranged as secondary reflectors 4 (Configuration a) and for a case in which nine layers of annular rings are arranged (Configuration b) are shown below.

Configuration a:

(A) Configuration Parameters

First layer—feeding element: square patch measuring 0.785 mm on a side (feeding point: 0.1 mm from center)

Second layer—annular ring: inside radius, 2.5 mm; outside radius, 3.25 mm

Third layer—annular ring: inside radius, 3.1 mm; outside radius, 3.85 mm

Fourth layer—annular ring: inside radius, 3.7 mm; outside radius, 4.45 mm

Fifth layer—annular ring: inside radius, 4.3 mm; outside radius, 5.05 mm

Tenth layer—circular patch: radius, 2.55 mm; slot radius, 0.57 mm (B) Characteristic Gain: 15.7 dBi (59 GHz)

Configuration b:

(A) Configuration Parameters

First layer—feeding element: square patch measuring 0.785 mm on a side (feeding point: 0.1 mm from center)

Second layer—annular ring: inside radius, 2.5 mm; outside radius, 3.25 mm

Third layer—annular ring: inside radius, 3.0 mm; outside radius, 3.75 mm

Fourth layer—annular ring: inside radius, 3.5 mm; outside radius, 4.25 mm

Fifth layer—annular ring: inside radius, 4.0 mm; outside radius, 4.75 mm

Sixth layer—annular ring: inside radius, 4.5 mm; outside radius, 5.25 mm

Seventh layer—annular ring: inside radius, 5.0 mm; outside radius, 5.75 mm

Eight layer—annular ring: inside radius, 5.5 mm; outside radius, 6.25 mm

Ninth layer—annular ring: inside radius, 6.0 mm; outside radius, 6.75 mm

Tenth layer—annular ring: inside radius, 6.5 mm; outside radius, 7.25 mm

Tenth layer—circular patch: radius, 2.55 mm; slot radius, 0.57 mm (B) Characteristic Gain: 16.0 dBi (60 GHz)

Figure 5:
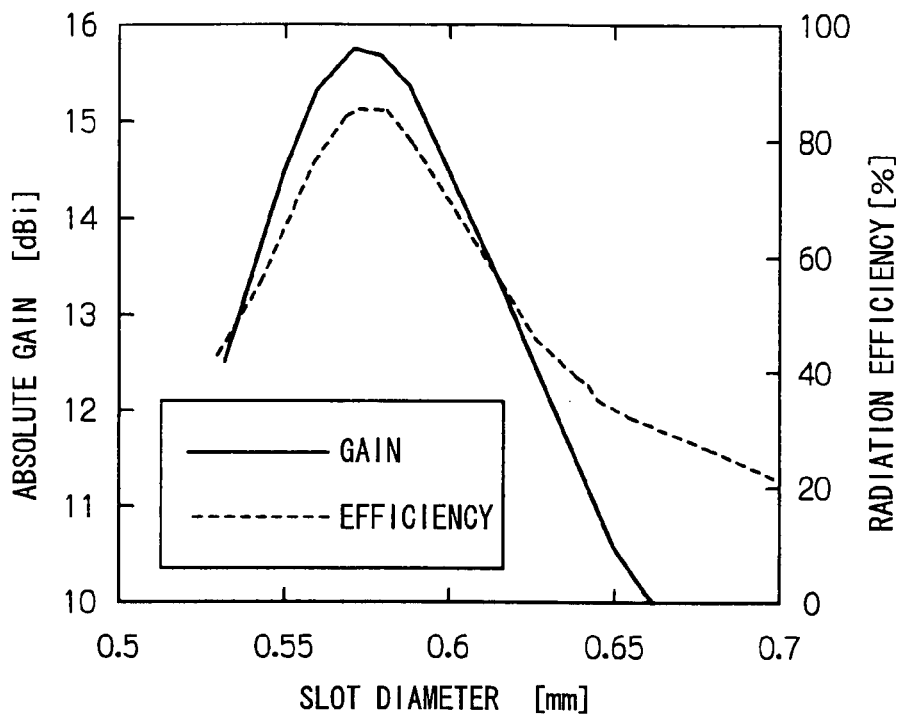
FIG. 5 is a graph showing the change in antenna characteristics with the slot shape.

Moreover, in Configuration a, the antenna characteristics change depending on the shape of the slot 6 provided in the primary reflector 3. FIG. 5 shows how the antenna characteristics change with the diameter of the slot 6. It is apparent from FIG. 5 that the antenna gain and the radiation efficiency have substantially similar characteristics, and that it is preferable to set the slot diameter to from 0.55 mm to 0.60 mm.

Figure 6:
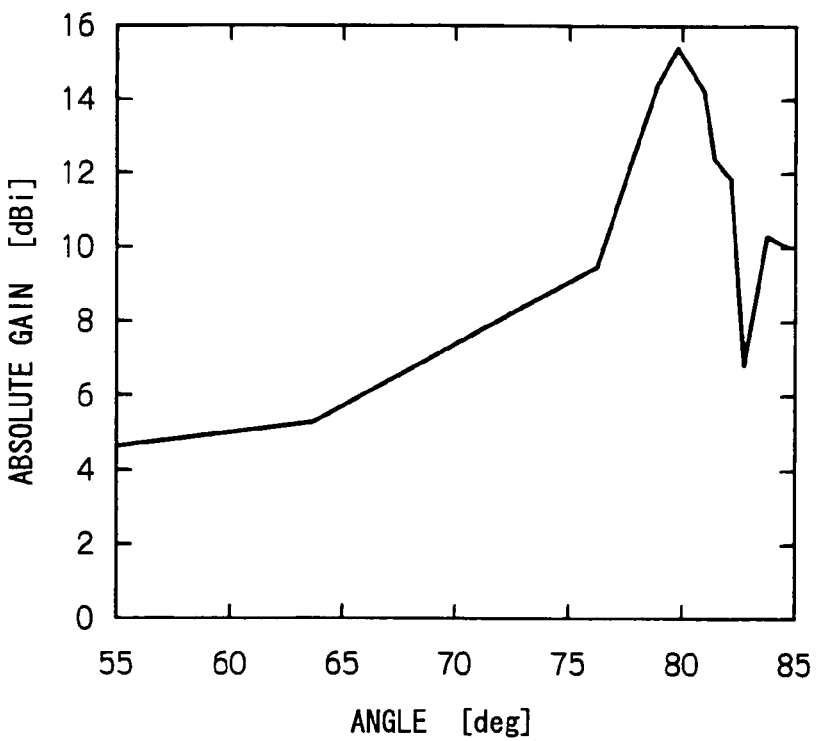
FIG. 6 is a graph showing the change in antenna characteristics with the arrangement angle of a surface of secondary reflectors.

Next, FIG. 6 shows the change in antenna characteristics with the placement of the secondary reflectors 4, as represented by the arrangement angle α of the surface of the secondary reflectors 4 shown in FIG. 3C. As is apparent from FIG. 6, the antenna gain undergoes large changes with the arrangement angle α of the secondary reflectors 4. The antenna characteristics are improved when the angle is about 80 degrees, with a relatively high-gain antenna being achievable within a range in the angle of from 78 degrees to 81 degrees.

Figure 7:
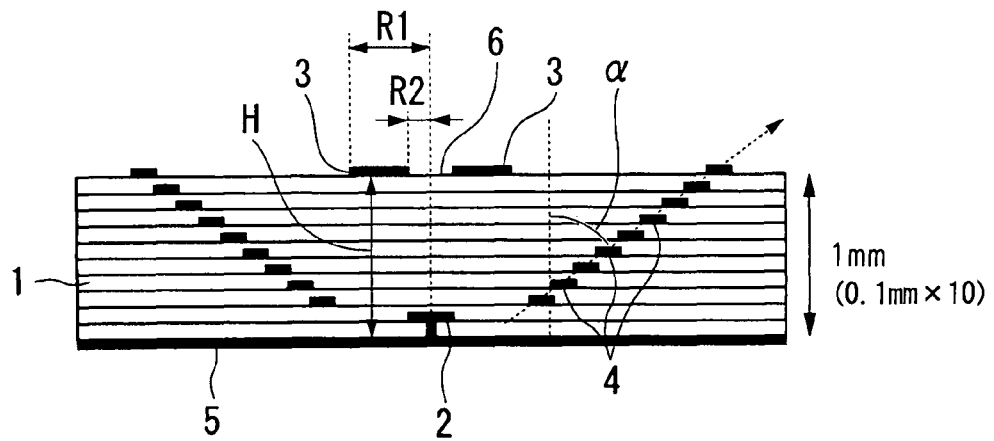
FIG. 7 shows an analytical model used for determining the antenna characteristics shown in FIGS. 8 to 11.

Moreover, FIGS. 8 to 11 show the antenna characteristics for various parameters other than the above, and are based on the analytical model shown in FIG. 7. The construction of the antenna device based on the analytical model in FIG. 7 is the same as the construction shown in FIG. 4B. In FIG. 7, H represents the height of the primary reflector 3 with respect to the surface of the ground plate 5 on the radiation direction side, R1 is the outside radius of the primary reflector 3, R2 is the radius of the slot 6, and α is the above-described arrangement angle of the surface of the secondary reflectors 4.

Figure 8:
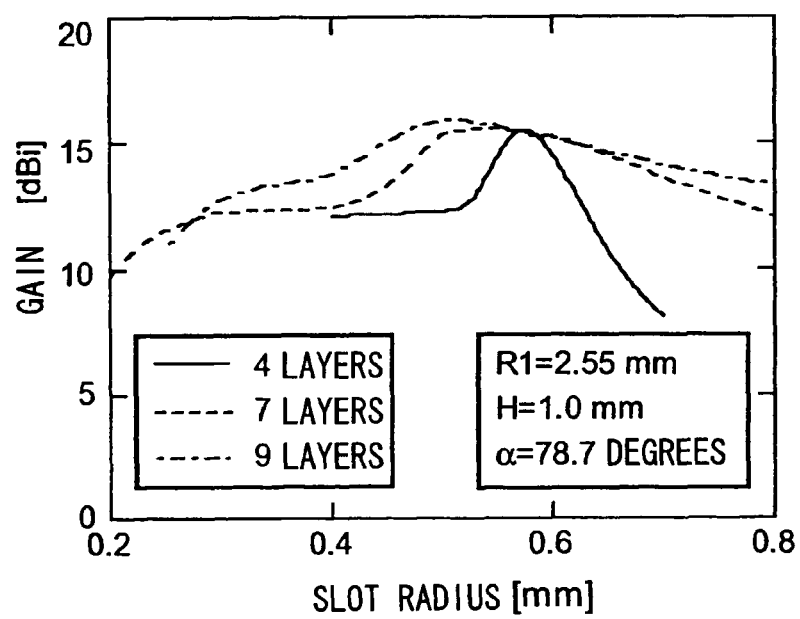
FIG. 8 is a diagram showing the relationship between slot radius and antenna characteristics (gain).
Figure 9:
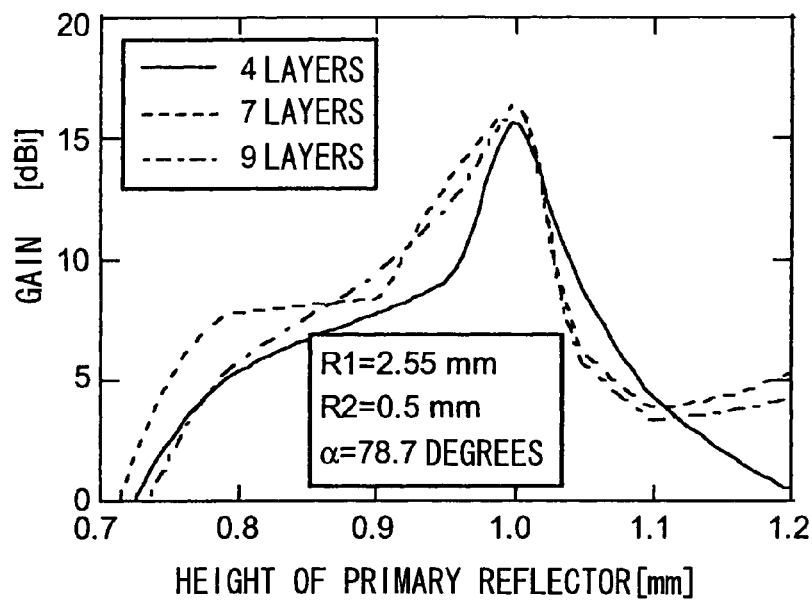
FIG. 9 is a diagram showing the relationship between the height of a primary reflector and antenna characteristics (gain).
Figure 10:
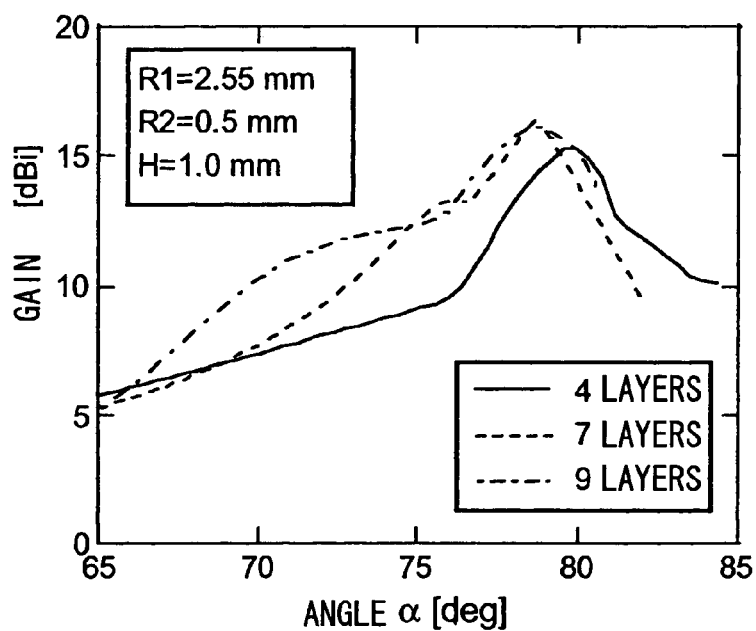
FIG. 10 is a diagram showing the relationship between the arrangement angle of the secondary reflectors and antenna characteristics (gain).
Figure 11:
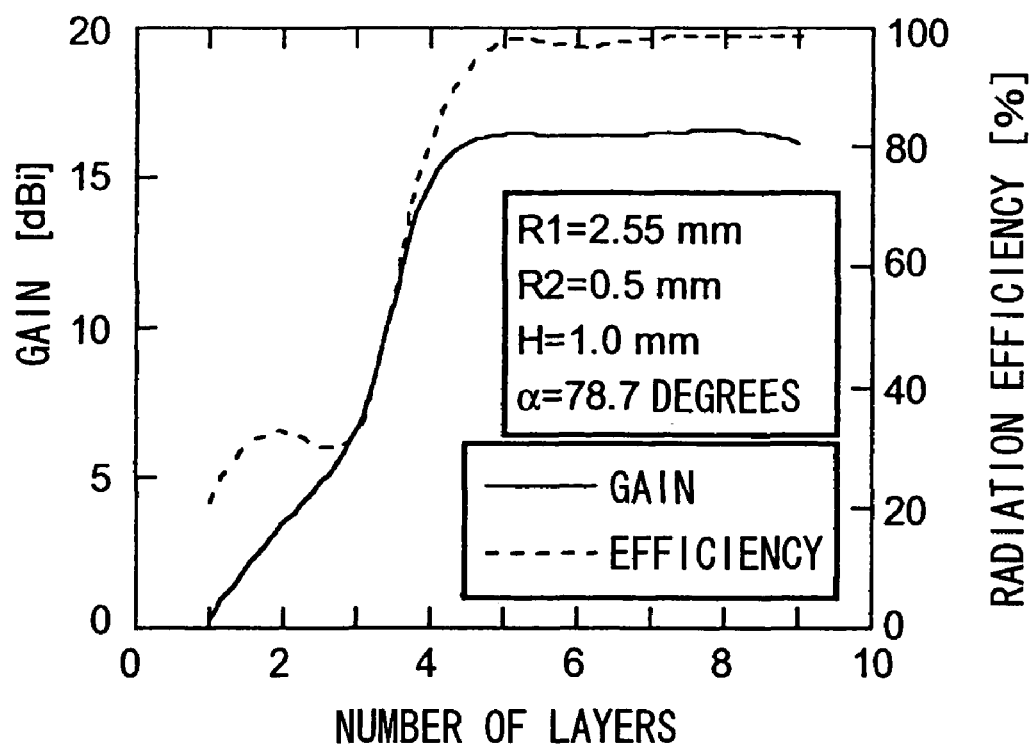
FIG. 11 is a diagram showing the relationship between the number of layers and antenna characteristics (gain and radiation efficiency).

FIG. 8 is a graph showing the relationship between the radius R2 of the slot 6 and the gain for cases in which the number of layers of dielectric substrates 1 is 4, 7 and 9. FIG. 9 is a graph showing the relationship between the height H of the primary reflector 3 and the gain for cases in which the number of layers of dielectric substrates 1 is 4, 7 and 9. FIG. 10 is a graph showing the relationship between the surface arrangement angle α and the gain for cases in which the number of layers of dielectric substrates 1 is 4, 7 and 9. FIG. 11 is a graph showing the relationship between the number of layers of dielectric substrates 1, the gain, and the radiation efficiency. As is apparent from these graphs, the gain can be adjusted to some degree by varying one or more of the following values: radius R2, height H, surface arrangement angle α, and the number of layers.

Fourth Embodiment

Figure 12A:
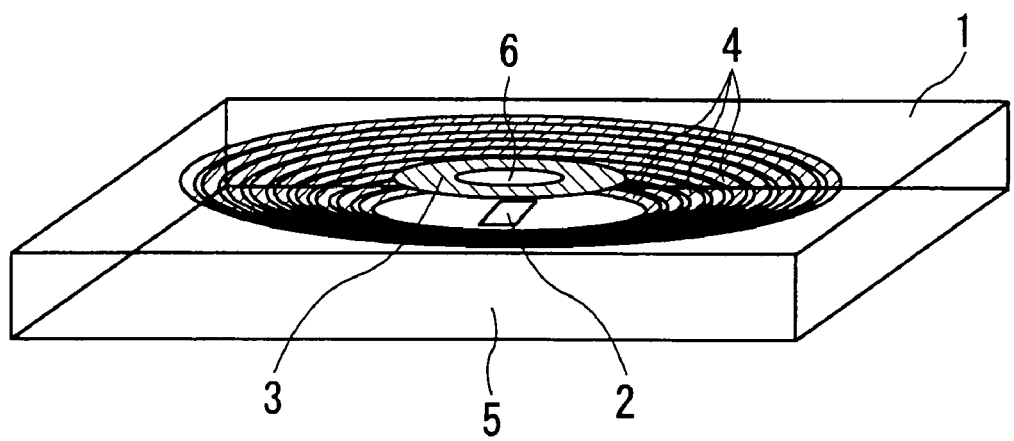
FIG. 12A is a perspective view showing the construction of an antenna device according to a fourth embodiment of the present invention.

FIGS. 12A (perspective view) and 12B (cross-sectional view) show the construction of an antenna device according to a fourth embodiment of the present invention. In these diagrams, 1 denotes dielectric substrates, 2 denotes a microstrip antenna, 3 denotes a primary reflector, 4 denotes secondary reflectors, 5 denotes a ground plate, 6 denotes a slot, and 8 denotes via holes or through holes.

Figure 12B:
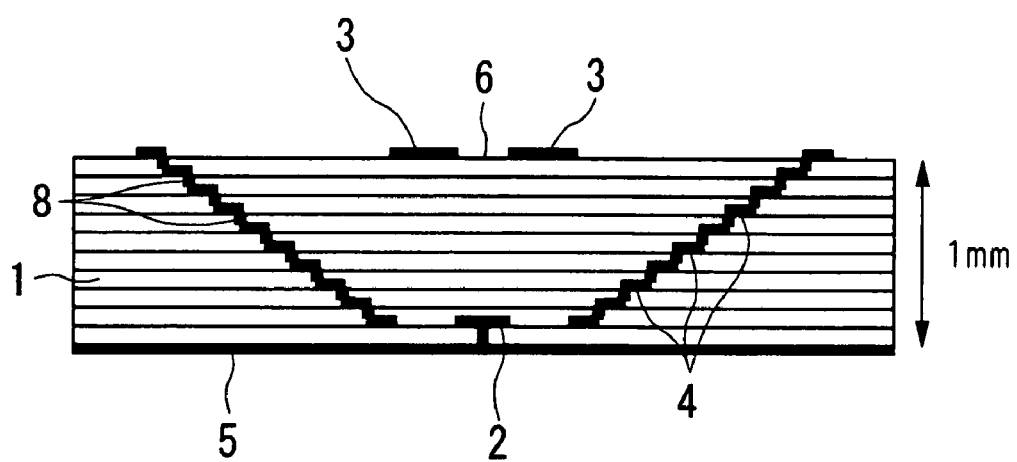
FIG. 12B is a cross-sectional view showing the construction of an antenna device according to the fourth embodiment of the present invention.

The antenna device according to the fourth embodiment shown in FIGS. 12A and 12B has a construction in which the layers of metal rings serving as the secondary reflectors 4 in the antenna construction of the third embodiment (FIGS. 4A and 4B) are connected therebetween by the addition of via holes or through holes 8.

By means of this construction, the electrical potential within the secondary reflectors 4 becomes common. This has the advantage of stabilizing antenna operation and minimizing disruptions in the directivity.

Fifth Embodiment

Figure 13A:
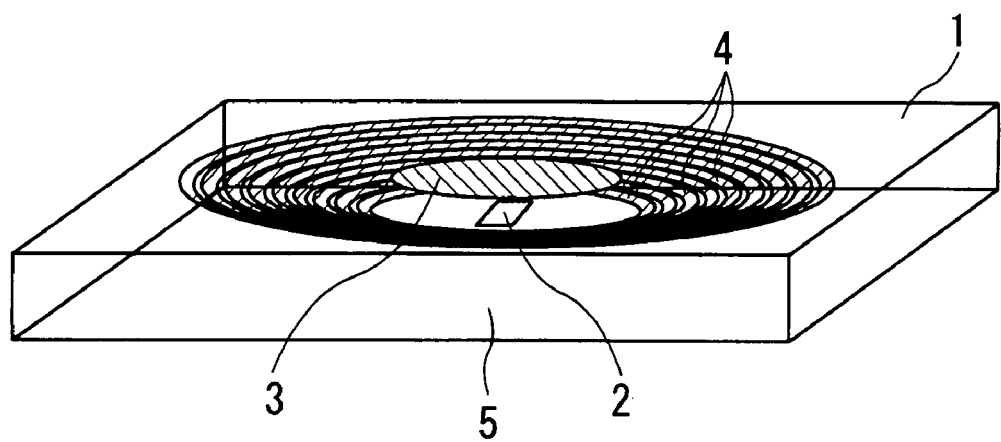
FIG. 13A is a perspective view showing the construction of an antenna device according to a fifth embodiment of the present invention.

FIGS. 13A (perspective view) and 13B (cross-sectional view) show the construction of an antenna device according to a fifth embodiment of the present invention. In these diagrams, 1 denotes dielectric substrates, 2 denotes a microstrip antenna, 3 denotes a primary reflector, 4 denotes secondary reflectors, 5 denotes a ground plate, 9 denotes a microstrip antenna array, and 31 denotes stubs.

The construction of the antenna device according to the fifth embodiment differs from that of the antenna device according to the first embodiment in the following two respects: a microstrip antenna array 9 which forms a planar antenna is located on the back surface of the primary reflector 3, and a stub 31 composed of a metal piece is attached to each antenna making up the microstrip antenna array 9. In other respects, the construction is the same.

The microstrip antenna array 9 temporarily stores energy of electromagnetic waves from the microstrip antenna 2, and re-radiates it after shifting the phase of the electromagnetic waves. In this embodiment, the stubs 31 are provided as a means for shifting the phase of the electromagnetic waves. The formed beam can be tilted by varying the sizes of the individual stubs 31.

This construction enables the reflected waves from the primary reflector 3 to be shaped so that they have the intended directivity. As a result, it is possible to control the overall radiation characteristics of the antenna device, including the secondary reflectors 4.

Sixth Embodiment

Figure 14A:
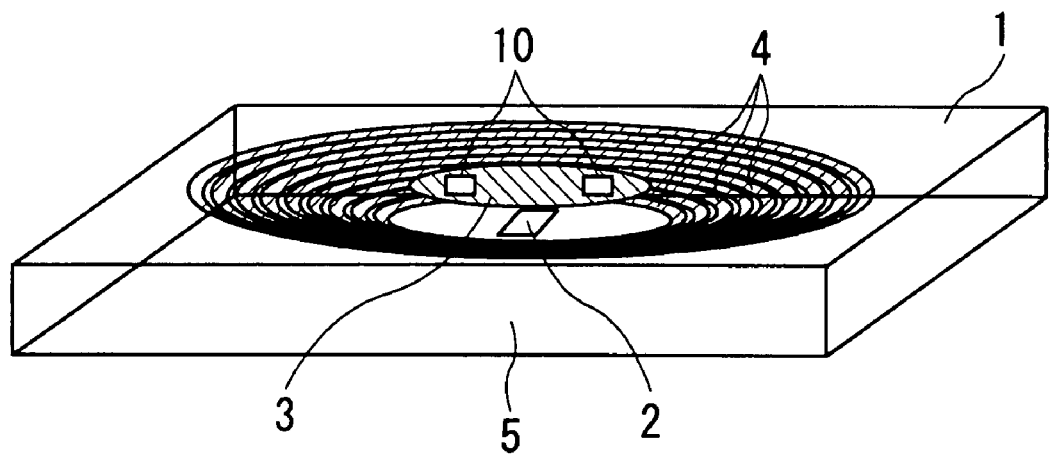
FIG. 14A is a perspective view showing the construction of an antenna device according to a sixth embodiment of the present invention.
Figure 14B:
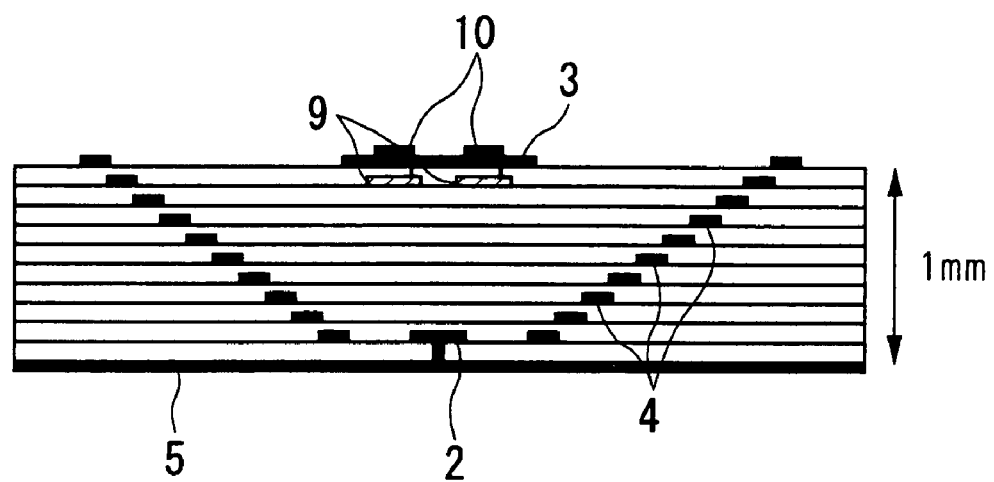
FIG. 14B is a cross-sectional view showing the construction of an antenna device according to the sixth embodiment of the present invention.

FIGS. 14A and 14B show the construction of an antenna device according to a sixth embodiment of the present invention. In these diagrams, 1 denotes dielectric substrates, 2 denotes a microstrip antenna, 3 denotes a primary reflector, 4 denotes secondary reflectors, 5 denotes a ground plate, 9 denotes a microstrip antenna array, and 10 denotes varactor diodes.

Figure 13B:
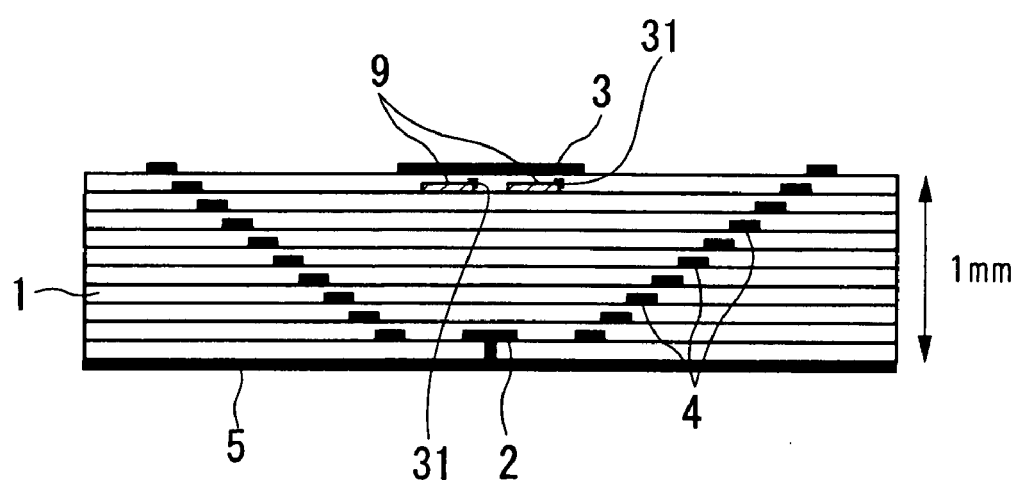
FIG. 13B is a cross-sectional view showing the construction of an antenna device according to the fifth embodiment of the present invention.

The antenna device according to the sixth embodiment shown in FIGS. 14A and 14B differs in construction from the antenna device according to the fifth embodiment (FIGS. 13A and 13B) by having varactor diodes 10, which are a type of variable capacitance element, as elements of the microstrip antenna array 9 located on the back surface of the primary reflector 3. In the example configuration shown in FIG. 14B, the varactor diodes 10 are located on the primary reflector 3, and are connected to the respective antenna making up the microstrip antenna array 9 by wires. As a result, although control of the fixed directivity was possible in the antenna device according to the fifth embodiment, the directivity in the present embodiment can be varied by controlling the voltage applied to the varactor diodes 10.

Seventh Embodiment

Figure 15:
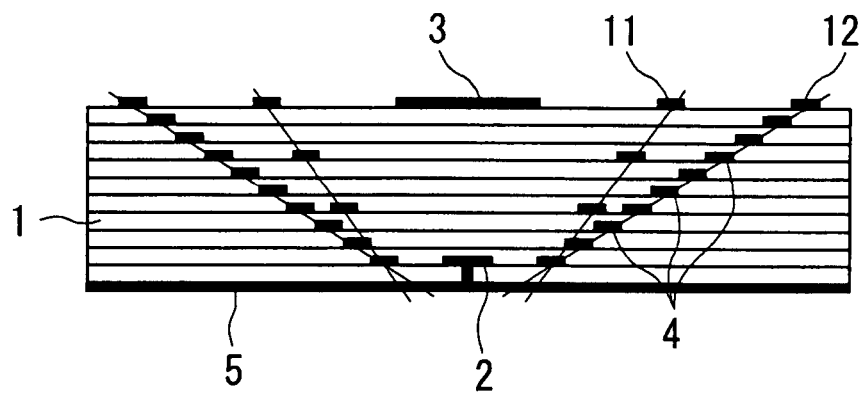
FIG. 15 is a cross-sectional view showing the construction of an antenna device according to a seventh embodiment of the present invention.

FIG. 15 shows the construction of an antenna device according to a seventh embodiment of the present invention. In this diagram, 1 denotes dielectric substrates, 2 denotes a microstrip antenna, 3 denotes a primary reflector, 4 denotes secondary reflectors, 5 denotes a ground plate, 11 denotes reflectors for a first frequency (f1), and 12 denotes reflectors for a second frequency (f2). It should be noted that the f1 reflectors 11 and the f2 reflectors 12 together constitute the secondary reflectors 4.

The antenna device according to the seventh embodiment shown in FIG. 15 differs in construction from the antenna device according to the first embodiment by having secondary reflectors which correspond to a plurality of frequencies. In the example given here, reflectors 11 for a first frequency and reflectors 12 for a second frequency are provided, thereby making up separate secondary reflectors for two different frequencies. The present embodiment takes advantage of the fact that by positioning the annular rings which make up the secondary reflectors 4 at sufficiently close intervals with respect to the wavelength, such a construction can be substantially regarded as a surface having no opening.

It should be noted that the antenna construction in the present embodiment can be commonly applied to three or more frequencies. As a result, it is possible to achieve different radiation characteristics at each of a plurality of frequencies.

Eighth Embodiment

Figure 16:
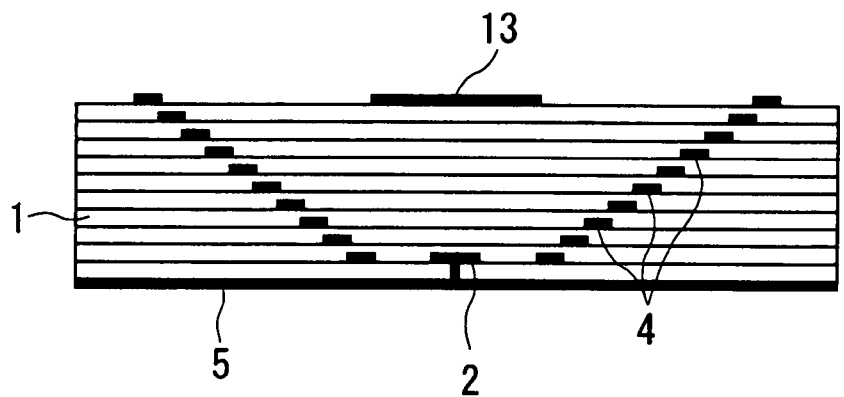
FIG. 16 is a cross-sectional view showing the construction of an antenna device according to an eighth embodiment of the present invention.

FIG. 16 shows the construction of an antenna device according to an eighth embodiment of the present invention. In this diagram, 1 denotes dielectric substrates, 2 denotes a microstrip antenna (driven element for f1), 4 denotes secondary reflectors, 5 denotes a ground plate, and 13 represents a primary reflector for the first frequency (f1) and a driven element for a second frequency (f2). It should be noted that the f2 frequency is set to a lower frequency than the f1 frequency. For example, the f1 frequency may be set to a millimeter wave frequency band (specifically, for example, 60 GHz), and the f2 frequency may be set to the 5 GHz band used in wireless LANs.

The antenna device according to the eighth embodiment shown in FIG. 16 differs in construction from the antenna device according to the first embodiment not only in that the microstrip antenna 2 is driven, but also in that the primary reflector 13 is driven in a frequency band which differs from the frequency band at which the microstrip antenna 2 is driven.

As a result, it is possible not only to operate the antenna device as a surface antenna for obtaining conventional narrow beam characteristics, but also to perform radiation using the driven element 13 for a second frequency for achieving broad radiation characteristics in a lower frequency band.

It should be noted that the present embodiment may also be applied to antenna devices according to other embodiments, such as the subsequently described tenth to twelfth embodiments.

Ninth Embodiment

Figure 17:
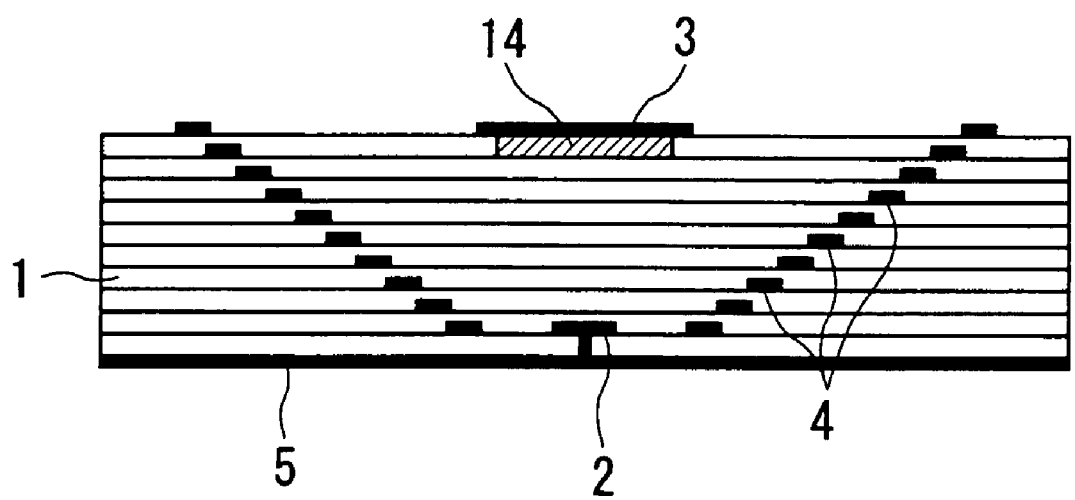
FIG. 17 is a cross-sectional view showing the construction of an antenna device according to a ninth embodiment of the present invention.

FIG. 17 shows the construction of an antenna device according to a ninth embodiment of the present invention. In the diagram, 1 denotes dielectric substrates, 2 denotes a microstrip antenna, 4 denotes secondary reflectors, 5 denotes a ground plate, and 14 denotes a micro-electro-mechanical system (MEMS) reflector.

The antenna device according to the ninth embodiment shown in FIG. 17 differs in construction from the antenna device according to the first embodiment by having a MEMS reflector 14 on the back surface of the primary reflector 3. As a result, the voltage value applied to the MEMS device changes the angle of the reflecting plate, enabling the control of reflected waves from the primary reflector 3. Hence, it is possible to vary the radiation characteristics of the overall antenna.

Tenth Embodiment

A tenth embodiment of the present invention is described below while referring to the accompanying diagrams. It should be noted that in the antenna devices according to the following tenth embodiment and the eleventh and twelfth embodiments described below are intended for cases in which the parasitic element is driven in a third order mode.

Figure 18A:
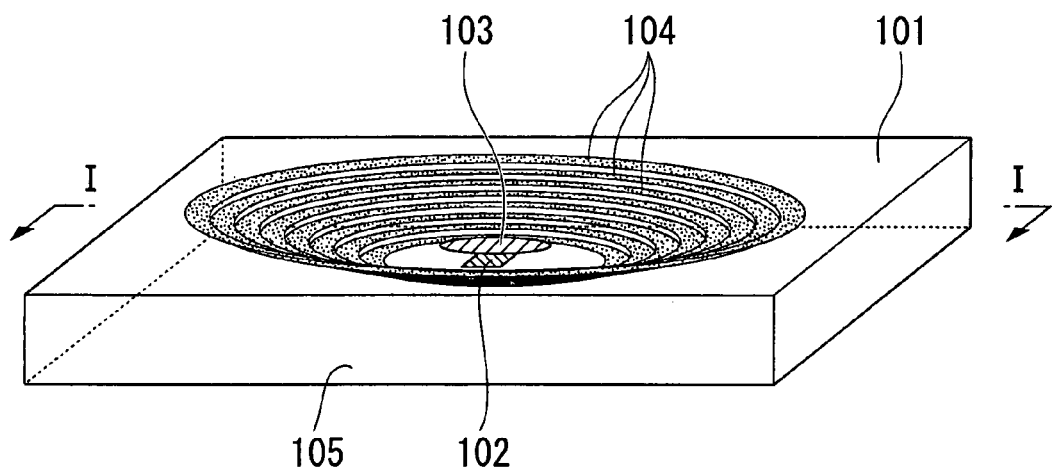
FIG. 18A is a perspective view showing an antenna device according to a tenth embodiment of the present invention.
Figure 18B:
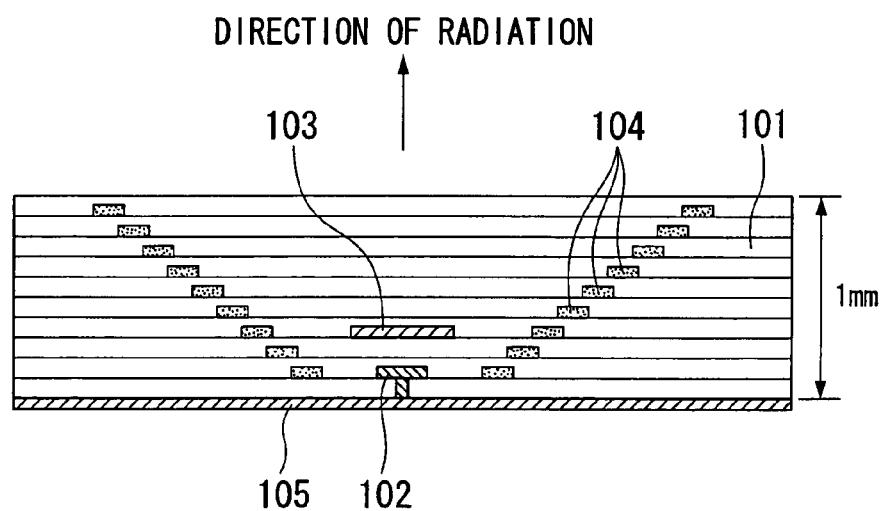
FIG. 18B is a cross-sectional view showing an antenna device according to the tenth embodiment of the present invention.

The structure of the antenna device in the tenth embodiment of the present invention is described while referring to FIGS. 18A and 18B, which show the antenna device of the tenth embodiment. FIG. 18A is a structural view (perspective view), and FIG. 18B is a cross-sectional view along line I-I in FIG. 18A.

As shown in FIG. 18B, the antenna device according to the tenth embodiment has a multilayer dielectric substrate 101 composed of a combination of 10 dielectric layers. In the present embodiment, a high-temperature co-fired ceramic (HTCC) substrate is used as the multilayer dielectric substrate 101. By using a HTCC substrate, at a frequency band such as the 60 GHz band, for example, the thickness of the multilayer dielectric substrate 101 can be set to about 1 mm (representing a thickness for the individual dielectric layers of about 0.1 mm). It should be noted that although the multilayer dielectric substrate 101 shown in FIG. 18B is a multilayer dielectric substrate composed of a combination of ten layers of dielectric, it suffices for the multilayer dielectric substrate to be a combination of two or more dielectric layers. In FIG. 18A, a depiction of the multilayer dielectric substrate 101 as being composed of a combination of ten layers of dielectric is not shown.

In the antenna device, a microstrip antenna 102 composed of a conductive member made of metal or the like is disposed at the surface of the bottommost dielectric layer on the radiation direction side thereof with respect to the direction of radiation (shown in FIG. 18B) in the multilayer dielectric substrate 101. The microstrip antenna 102 is a feeding element which functions as a single-element antenna.

Moreover, the antenna device has a parasitic element 103 which is disposed further on the radiation direction side than the microstrip antenna 102. The parasitic element 103 is made of metal and has a circular shape. For example, as shown in the results of analysis mentioned subsequently, when the parasitic element 103 has a diameter which is from 1.48 times to 2.16 times the wavelength (i.e., from 1.48 wavelengths to 2.16 wavelengths) within the dielectric of the multilayer dielectric substrate 101 (abbreviated below as "wavelength in the dielectric"), a gain of 10 dBi or more can be achieved. When the diameter of the parasitic element 103 is from 1.62 times to 1.86 times the wavelength in the dielectric (i.e., from 1.62 wavelengths to 1.86 wavelengths), a gain of 15 dBi or more can be achieved. It should be noted that the shape of the parasitic element 103 need not be circular, and may instead be square. In this case too, when one side of the parasitic element 103 is from 1.48 times to 2.16 times the wavelength in the dielectric (i.e., from 1.48 wavelengths to 2.16 wavelengths), a gain of 10 dBi or more can be achieved. When one side of the parasitic element 103 is from 1.62 times to 1.86 times the wavelength in the dielectric (i.e., from 1.62 wavelengths to 1.86 wavelengths), a gain of 15 dBi or more can be achieved.

It should be noted that although the parasitic element 103 has been given a circular shape, the circular shape shall be understood to include elliptical shapes. If the parasitic element 103 is elliptical, it suffices for at least the major axis or minor axis of the ellipse to meet the same conditions as the diameter of a circular parasitic element. Nor is any limit imposed on the square shape, which may encompass any rectangular shape, including that of an elongated rectangle. In such a case, at least one side of the elongated rectangular should satisfy the same conditions as when the shape is square. Moreover, the shape of the parasitic element 103 is not limited to a precise circular shape or rectangular shape, and may instead be, for example, a shape from which a portion is missing or a shape which is partly deformed.

Moreover, in the antenna device, secondary reflectors 104 which are conductive members made of metal or the like are disposed at the respective surfaces on the radiation direction sides of a second dielectric layer to a bottommost dielectric layer (tenth layer) with respect to the direction of radiation in the multilayer dielectric substrate 101. The secondary reflectors 104 have an annular (circular) construction wherein the outer circumference and the inner circumference each describe circles. Moreover, as one moves from the secondary reflector 104 disposed at the surface on the radiation direction side of the second dielectric layer toward the secondary reflector 104 disposed at the surface on the radiation direction side of the bottommost dielectric layer (tenth layer), the diameters of the respective secondary reflectors 104 become successively smaller.

It should be noted that the dielectrics having a secondary reflector 104 disposed thereon are not limited only to those mentioned above. For example, a secondary reflector 104 may be situated on each of the ten layers. Moreover, the annular shape of the secondary reflectors 104 is not limited to one in which the outer circumference and the inner circumference are circles; it is also possible for the outer and inner circumferences to be ellipses (having elliptical shapes) or rectangular (in the shape of rectangular loops).

Furthermore, in the antenna device, a ground plate 105 is positioned at the surface of the multilayer dielectric substrate 101 on the side thereof opposite to the direction of radiation by the antenna device. The microstrip antenna 102 is grounded to the ground plate 105.

In the operation of the antenna device having the construction shown in FIGS. 18A and 18B, electromagnetic waves radiated by the microstrip antenna 102 are re-radiated by the parasitic element 103, then reflected by the secondary reflectors 104.

It should be noted that unlike the first to ninth embodiments, the present embodiment has no primary reflector. However, in order to enable the correspondence between the present embodiment and the first and ninth embodiments to be more easily understood, reference symbol 104 is denoted as secondary reflectors in accordance with the first to ninth embodiments.

Figure 19:
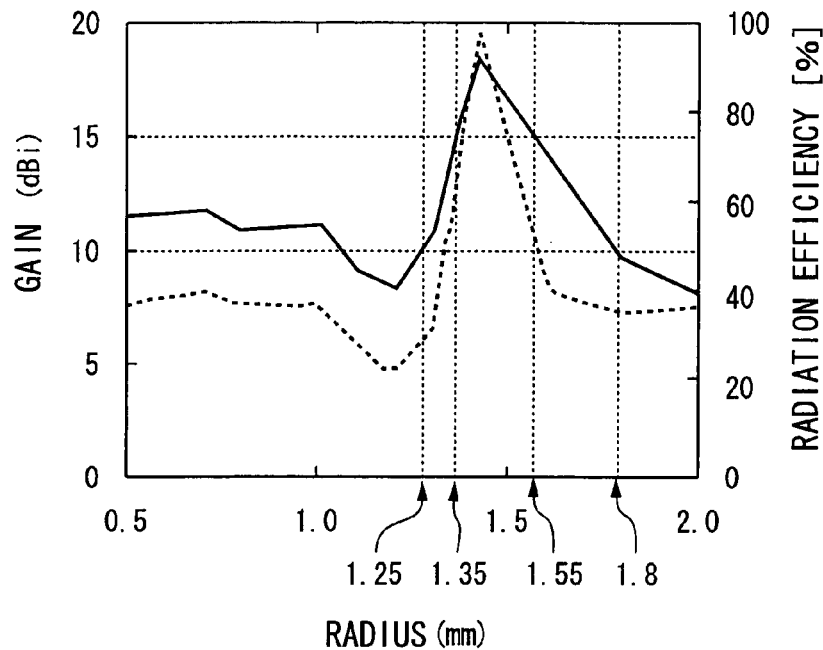
FIG. 19 is a diagram showing the antenna characteristics for the parasitic elements in the antenna devices shown in FIGS. 18A and 18B with the shape thereof.

FIG. 19 shows, as the results of analysis by the moment method, antenna characteristics with respect to the shape of the parasitic element 103 in the antenna device shown in FIGS. 18A and 18B. It should be noted that in FIG. 19, the abscissa represents the radius (mm) of a circular parasitic element 103 and the ordinate represents the gain (dBi) and the radiation efficiency (%). It should be noted that in FIG. 19, the solid line is the gain, and the dashed line is the radiation efficiency.

Here, analysis by the moment method is carried out under the following conditions. The frequency band of the electromagnetic wave is set at 60 GHz. The multilayer dielectric substrate 101 used is made of ten layers of dielectric having a thickness per layer of 0.1 mm, and is an HTCC substrate with a dielectric constant of 9.0. The height of the parasitic element 103 is 0.3 mm from the surface of the ground plate 105 on the radiation direction thereof. The secondary reflectors 104 are respectively disposed at the surfaces on the radiation direction sides of the second dielectric layer to the bottommost dielectric layer (tenth layer) with respect to the direction of radiation in the multilayer dielectric substrate 101.

Letting the relative dielectric constant be $\in_r$, and the frequency be f, the wavelength in the dielectric $\lambda$ can be determined as follows. Here, c is the speed of light in a vacuum.

$$\lambda = c/f \times (1/(\in_r)^{1/2})$$

Because the frequency used in analysis is 60 GHz, the relative dielectric constant of the HTCC substrate is 9, and the speed of light is $3 \times 10^8$ m/s, the wavelength $\lambda$ in the dielectric is obtained thus $$\lambda = 3 \times 10^8/(60 \times 10^9) \times (1/(9)^{1/2}) = 1.67 \times 10^{-3} \text{ m} = 1.67 \text{ mm}.$$

By using this value, it is possible to calculate the multiple of the wavelength in the dielectric that the diameter of the parasitic element 103 represents, based on the radius (mm) of the parasitic element 103 in FIG. 19. It should be noted that if one also takes into account propagation in areas close to an air layer, as in the antenna device of the present embodiment, it is conceivable that the actual wavelength in the dielectric will be a little longer than 1.67 mm. Accordingly, the wavelength in the dielectric can be regarded as being about 1.67 mm.

From the analytical results in FIG. 19, a maximum gain of 18.6 dBi is achievable. Moreover, at a parasitic element 103 diameter of from 1.48 times to 2.16 times the wavelength in the dielectric (1.48 wavelengths to 2.16 wavelengths), a gain of 10 dBi or more is achievable. At a parasitic element 103 diameter of from 1.62 times to 1.86 times the wavelength in the dielectric (1.62 wavelengths to 1.86 wavelengths), a gain of 15 dBi or more is achievable.

That is, with the antenna device of the present embodiment, a high gain of 10 dBi or more can be achieved, and it is even possible to achieve a high gain of 15 dBi or more.

It should be noted that because the antenna device in FIGS. 18A and 18B operates in the same way regardless of whether the parasitic element 103 has a circular shape or a square shape, about the same gain (in dBi) is obtainable when the diameter of the circular parasitic element and the length on one side of the square parasitic element are the same.

Figure 20:
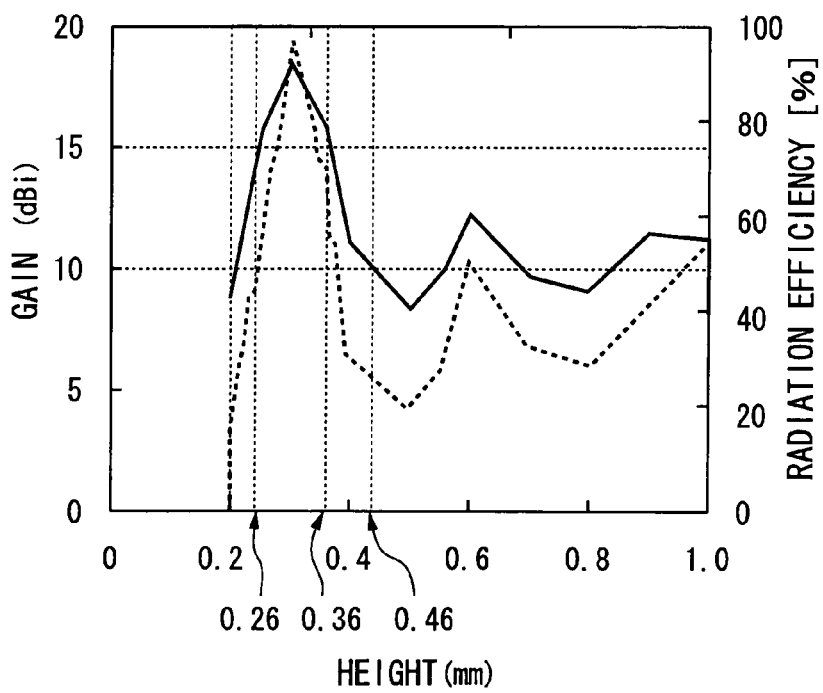
FIG. 20 is a diagram showing the antenna characteristics for the parasitic elements in the antenna devices shown in FIGS. 18A and 18B with the height thereof.

Moreover, FIG. 20 shows, as the result of analysis by the moment method, antenna characteristics with respect to the height of the parasitic element 103 for the antenna device shown in FIGS. 18A and 18B. It should be noted that in FIG. 20, the abscissa represents the height (mm) of the parasitic element 103 from the surface of the ground plate 105 on the radiation direction side thereof and the ordinate represents the gain (dBi) and the radiation efficiency (%). It should be noted that in FIG. 20, the solid line is the gain and the dashed line is the radiation efficiency.

Here, analysis by the moment method is carried out under the following conditions. The frequency band of the electromagnetic wave is set at 60 GHz. The multilayer dielectric substrate 101 used is made of ten layers of dielectric having a thickness per layer of 0.1 mm, and is an HTCC substrate having a relative dielectric constant of 9.0. The diameter of the parasitic element 103 is 2.8 mm. The secondary reflectors 104 are respectively disposed on the surfaces at the radiation direction sides of the second dielectric layer to the bottommost dielectric layer (tenth layer) with respect to the direction of radiation in the multilayer dielectric substrate 101.

From the analytical results in FIG. 20, at a parasitic element 103 height of from 0.2 mm to 0.46 mm, a gain of 10 dBi or more is achievable. Moreover, given that, as noted above, the wavelength λ in the dielectric is about 1.67 mm, the height of the parasitic element 103 expressed in terms of the wavelength is from about 0.12 wavelength to about 0.28 wavelength. At a parasitic element 103 height of from 0.26 mm to 0.36 mm, a gain of 15 dBi or more is achievable. Expressed in terms of the wavelength, the height of the parasitic element 103 in this case is from about 0.16 to about 0.22 wavelength.

That is, with the antenna device of the present embodiment, a high gain of 10 dBi or more can be achieved, and it is even possible to achieve a high gain of 15 dBi or more.

Figure 21:
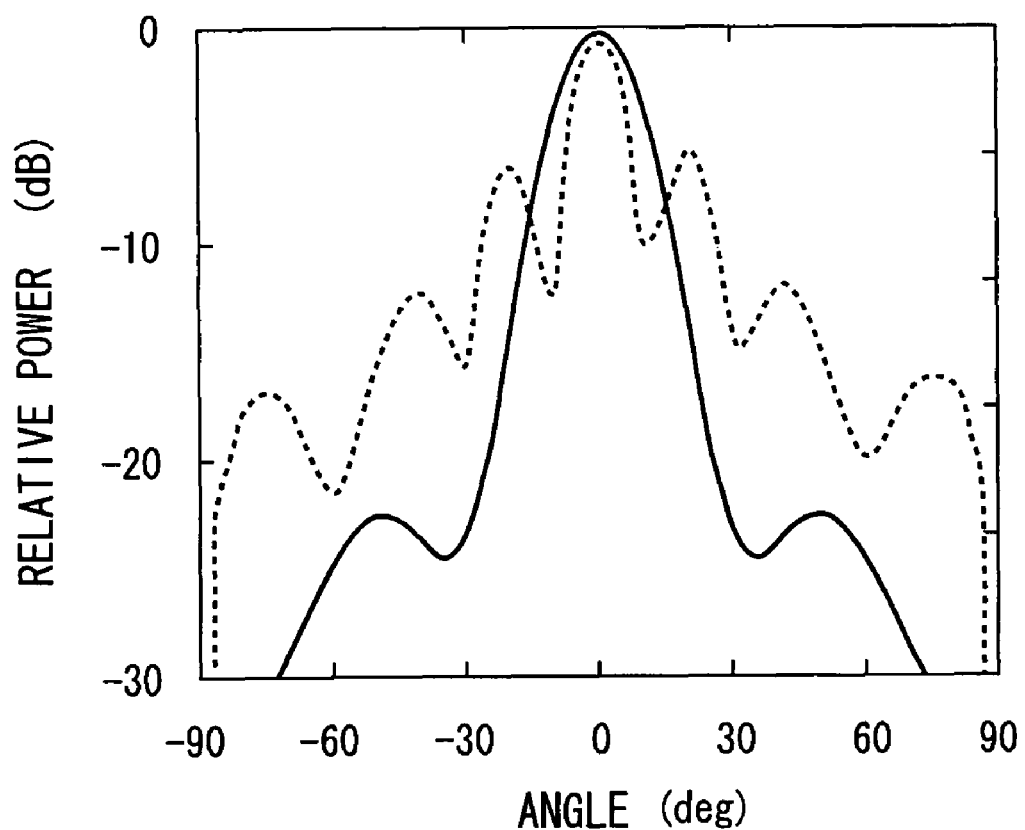
FIG. 21 is a diagram showing the radiation characteristics of the antenna devices shown in FIGS. 18A and 18B.

FIG. 21 shows, as the result of analysis by the moment method, the radiation characteristics of the antenna device shown in FIGS. 18A and 18B. It should be noted that in FIG. 21, the abscissa represents the angle (degrees) and the ordinate represents the relative power (dB). It should be noted that in FIG. 21, the solid line is an H-plane antenna pattern, and the dashed line is an E-plane antenna pattern. In the present embodiment, because the parasitic element 103 is provided for the purpose of peripherally scattering electromagnetic waves from the microstrip antenna 102, the size thereof is larger than that of commonly used parasitic elements. Hence, a plurality of standing waves are generated, resulting in characteristics having, as shown in FIG. 21, large side lobes.

Here, analysis by the moment method is carried out under the following conditions. The frequency band of the electromagnetic wave is set at 60 GHz. The multilayer dielectric substrate 101 used is made of ten layers of dielectric having a thickness per layer of 0.1 mm, and is an HTCC substrate having a relative dielectric constant of 9.0. The diameter of the parasitic element 103 is 2.8 mm, and the height from the surface of the ground plate 105 on the radiation direction side thereof is 0.3 mm. The secondary reflectors 104 are respectively disposed on the surfaces at the radiation direction sides of the second dielectric layer to the bottommost dielectric layer (tenth layer) with respect to the direction of radiation in the multilayer dielectric substrate 101.

Eleventh Embodiment

An eleventh embodiment of the present invention is described below while referring to the accompanying diagrams.

Figure 22A:
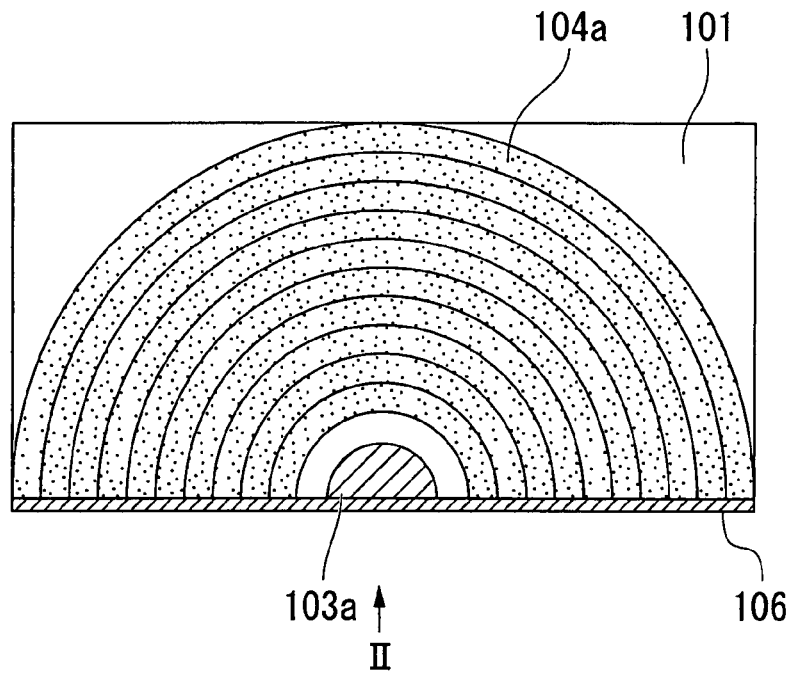
FIG. 22A is a top view showing the construction of an antenna device according to an eleventh embodiment of the present invention.
Figure 22B:
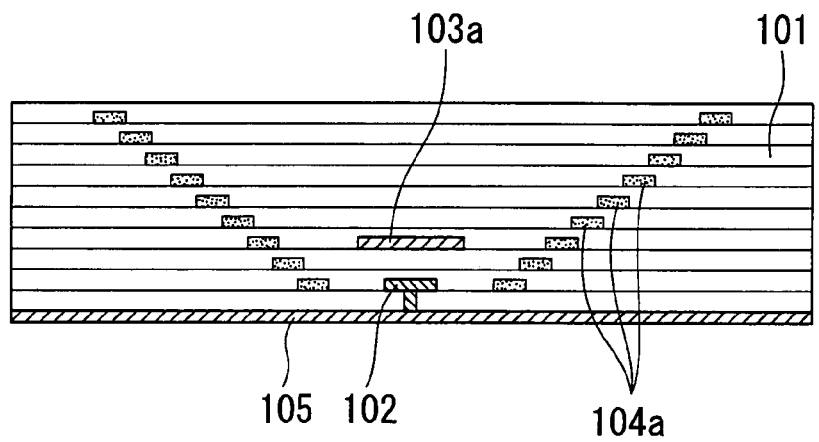
FIG. 22B is a side view showing the construction of an antenna device according to the eleventh embodiment of the present invention.

The construction of the antenna device according to the eleventh embodiment of the present invention is described while referring to FIGS. 22A and 22B. FIGS. 22A and 22B are diagrams showing the antenna device of the eleventh embodiment, FIG. 22A being a top view and FIG. 22B being a side view as seen from the II direction in FIG. 22A. It should be noted that although a microstrip antenna 102 is not shown in FIG. 22A, the antenna device of the eleventh embodiment does have a microstrip antenna which is provided at a position that is not in contact with the subsequently described conductor plate 106.

The antenna device according to the eleventh embodiment shown in FIGS. 22A and 22B differs in the following way from the antenna device according to the tenth embodiment shown in FIGS. 18A and 18B. In place of the annular secondary reflectors 104 in FIGS. 18A and 18B, the antenna device of the present embodiment has secondary reflectors 104a with shapes that, as shown in FIG. 22A, may be described as ring-like with outer and inner circumferences that are circles, but from which one-half (a 180-degree portion) of the ring has been removed. Also, in place of the circular parasitic element 103 shown in FIGS. 18A and 18B, the antenna device of the present embodiment has a semi-circular parasitic element 103a like that shown in FIG. 22A. Furthermore, in the antenna device, the flat conductor plate 106 which connects both ends of the secondary reflectors 104a is provided over the entire side wall of the antenna device as seen from the II direction in FIG. 22A.

It should be noted that other aspects of the construction being substantially the same as for the antenna device in the tenth embodiment shown in FIGS. 18A and 18B, further details are omitted here.

Because, as mentioned above, the antenna device according to the eleventh embodiment has a construction which generates an image (a mirror image) of the secondary reflectors 104a, etc., by means of the conductor plate 106, compared with the antenna device of FIGS. 18A and 18B, the surface area in the plan view as seen from the direction of radiation by the antenna device can be made substantially one-half as large, enabling the size of the antenna device to be made smaller. Moreover, given that the aperture is in one place and the microstrip antenna is positioned near the edge surface of the antenna device, this arrangement has the advantage of facilitating connection to a feeding circuit or the like.

Figure 23A:
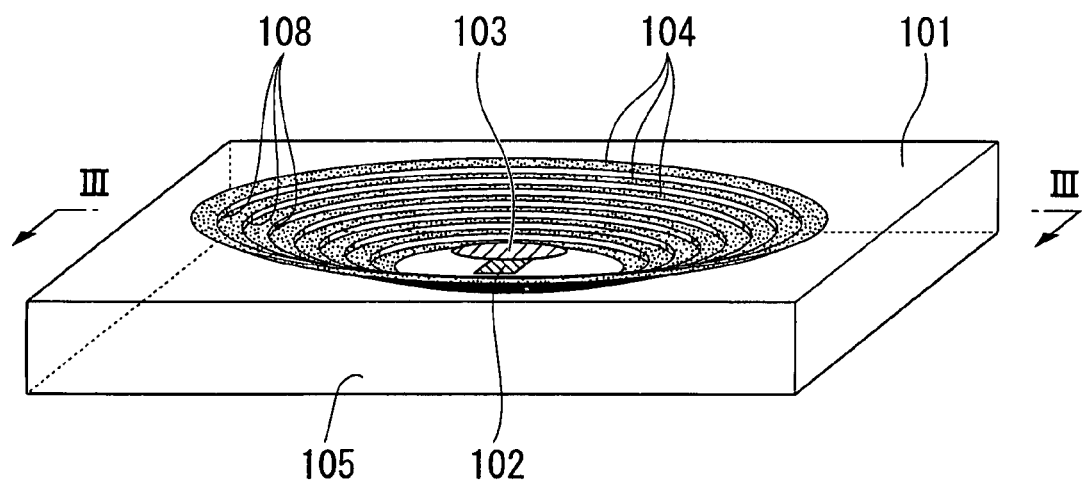
FIG. 23A is a perspective view showing an antenna device according to a twelfth embodiment of the present invention.
Figure 23B:
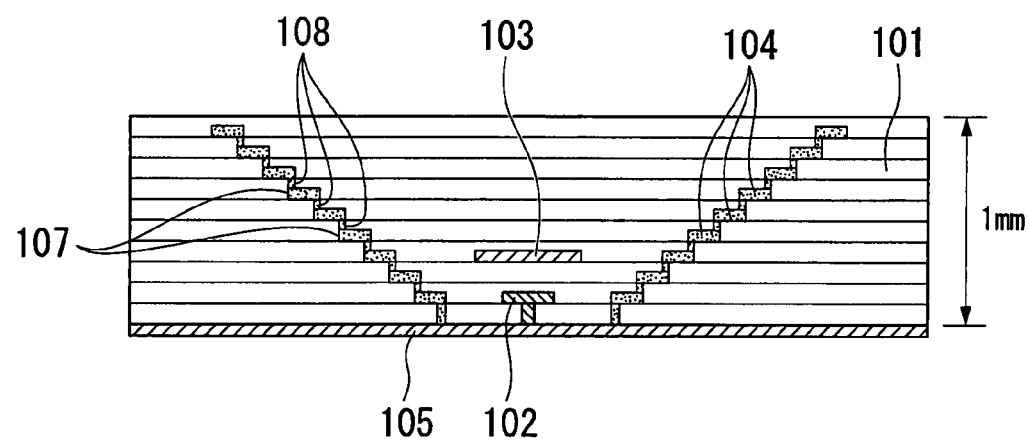
FIG. 23B is a cross-sectional view showing the construction of an antenna device according to the twelfth embodiment of the present invention.

It should be noted that in the antenna device of FIGS. 23A and 23B, the secondary reflectors 104a have shapes in which one-half (a 180-degree portion) of the ring is removed. However, the secondary reflectors in the present embodiment are not limited to this shape, and may instead have a shape in which, for example, three-quarters (a 270-degree portion) of the ring is removed.

Twelfth Embodiment

A twelfth embodiment of the present invention is described below while referring to the accompanying diagrams.

The construction of the antenna device according to the twelfth embodiment of the present invention is described while referring to FIGS. 23A and 23B. FIGS. 23A and 23B are diagrams showing the antenna device of the twelfth embodiment. FIG. 23A is a structural view, and FIG. 23B is a cross-sectional view along line III-III in FIG. 23A.

The antenna device according to the twelfth embodiment shown in FIGS. 23A and 23B differs from the antenna device according to the tenth embodiment shown in FIGS. 18A and 18B in that a through hole 107 (or a via hole) is provided in each dielectric layer in the multilayer dielectric substrate 101. Moreover, in the antenna device of the present embodiment, conductors 108 of metal or the like are provided within the through holes 107. These conductors 108 connect together the mutually adjoining secondary reflectors 104 which are present on both sides of the respective dielectric layers. That is, each secondary reflector 104 is connected to all the other secondary reflectors 104 via other secondary reflectors 104 and the conductors 108. Moreover, the secondary reflector 104 provided on the bottommost layer with respect to the direction of radiation in the multilayer dielectric substrate 101 is connected to the ground plate 105 by a conductor 108 within a through hole 107.

It should be noted that other aspects of the construction being substantially the same as for the antenna device in the tenth embodiment shown in FIGS. 18A and 18B, further details are omitted here.

Because, as mentioned above, the antenna device according to the twelfth embodiment has a construction in which through holes 107 are provided in respective dielectric layers in the multilayer dielectric substrate 101, conductors 108 are placed therein, and the respective secondary reflectors 104 are connected to each other using the conductors 108, each of the secondary reflectors 104 has the same electric potential. Therefore, operation of the antenna device is stable, reducing disruptions in the directivity.

Moreover, because the respective secondary reflectors 104 are configured in such a way as to be connected to the ground plate 105 by the conductor 108 or by the conductors 108 and other secondary reflectors 104, not only do each of the secondary reflectors 104 have the same electric potential, a constant potential is maintained, enabling an even better antenna device to be achieved.

It should be noted that the antenna device shown in FIGS. 23A and 23B has a construction in which mutually neighboring secondary reflectors 104 are connected. However, the antenna device in the present embodiment is not limited to this construction, and may instead have a construction in which the respective secondary reflectors 104 are connected to all the other secondary reflectors 104 via any one or more of the following: other secondary reflectors, conductors 108, and the ground plate 105. For example, in order that the individual secondary reflectors 104 are directly connected to the ground plate 105, through holes may be provided in the multilayer dielectric substrate 101 and conductors placed in the through holes, thereby connecting each secondary reflector 104 to the ground plate 105.

Thirteenth Embodiment

Figure 24:
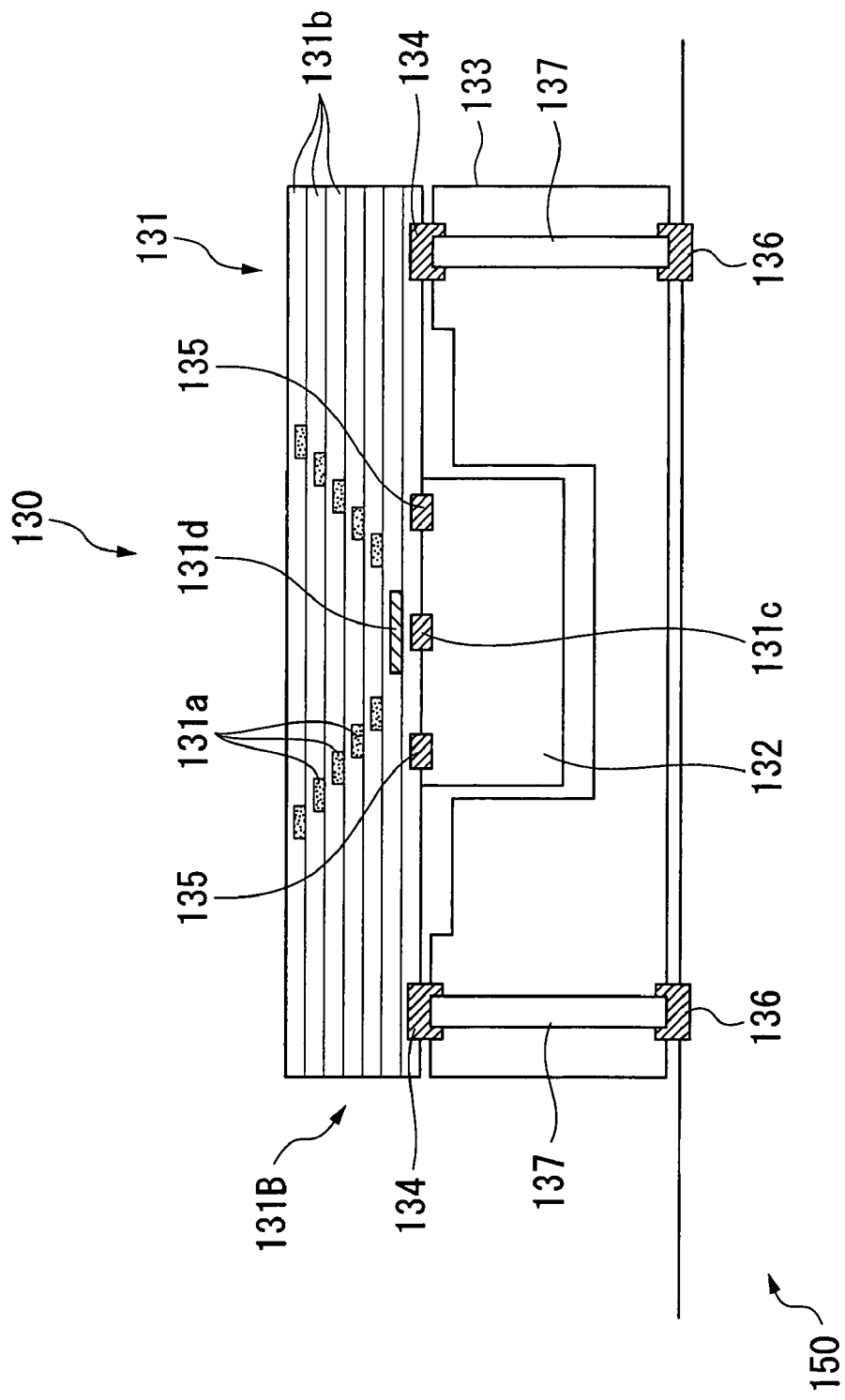
FIG. 24 is a diagram showing an example in which the antenna device is implemented as a system-on-package according to a thirteenth embodiment of the present invention.

An RF package which employs an antenna device according to the above-described embodiments is described while referring to FIG. 24. FIG. 24 is a schematic view of an RF package which uses an antenna device. It is shown mounted on a motherboard 150.

An RF package 130 has: a holding member 133 having via holes 137; and an antenna device 131 which is mounted on the via holes 137 using bumps 134. The holding member 133 having via holes 137 forms a substrate which has a cavity structure or a void structure. Although the antenna device 131 may be any antenna device according to the above-described embodiments, the configuration shown in FIG. 24 is an example having a multilayer dielectric substrate 131B made up of a combination of a plurality of dielectric layers 131b, secondary reflectors 131a provided on the plurality of layers in the multilayer dielectric substrate 131B, a feeding element (e.g., a microstrip antenna) 131c, and a parasitic element 131d. Moreover, the package 130 is provided with a highly integrated microwave monolithic integrated circuit (MMIC) chip (active device) 132 on the side of the antenna device 131 opposite to the direction of radiation, which is attached to the antenna device 131 using bumps 135. It should be noted that the bumps 135 electrically connect terminals provided on the bottom surface of the antenna device 131 with terminals provided on the top surface of the MMIC 132.

In addition, bumps 136 are used to attach the via holes 137 to the motherboard 150. That is, respective terminals, such as power supply terminals, control terminals, and data input/output terminals provided on the bottom surface of the antenna device 131 are electrically connected by the bumps 134, the via holes 137, and the bumps 136 to respective terminals provided on the motherboard 150.

It should be noted that the functions provided in the MMIC chip 132 differ depending on the system configuration and other factors. Illustrative examples include down-converters and up-converters which carry out frequency conversion, and amplifiers for reducing noise and loss. In addition, in some cases the functions of a transceiver or the functions of a modem are also provided.

Fourteenth Embodiment

Figure 25:
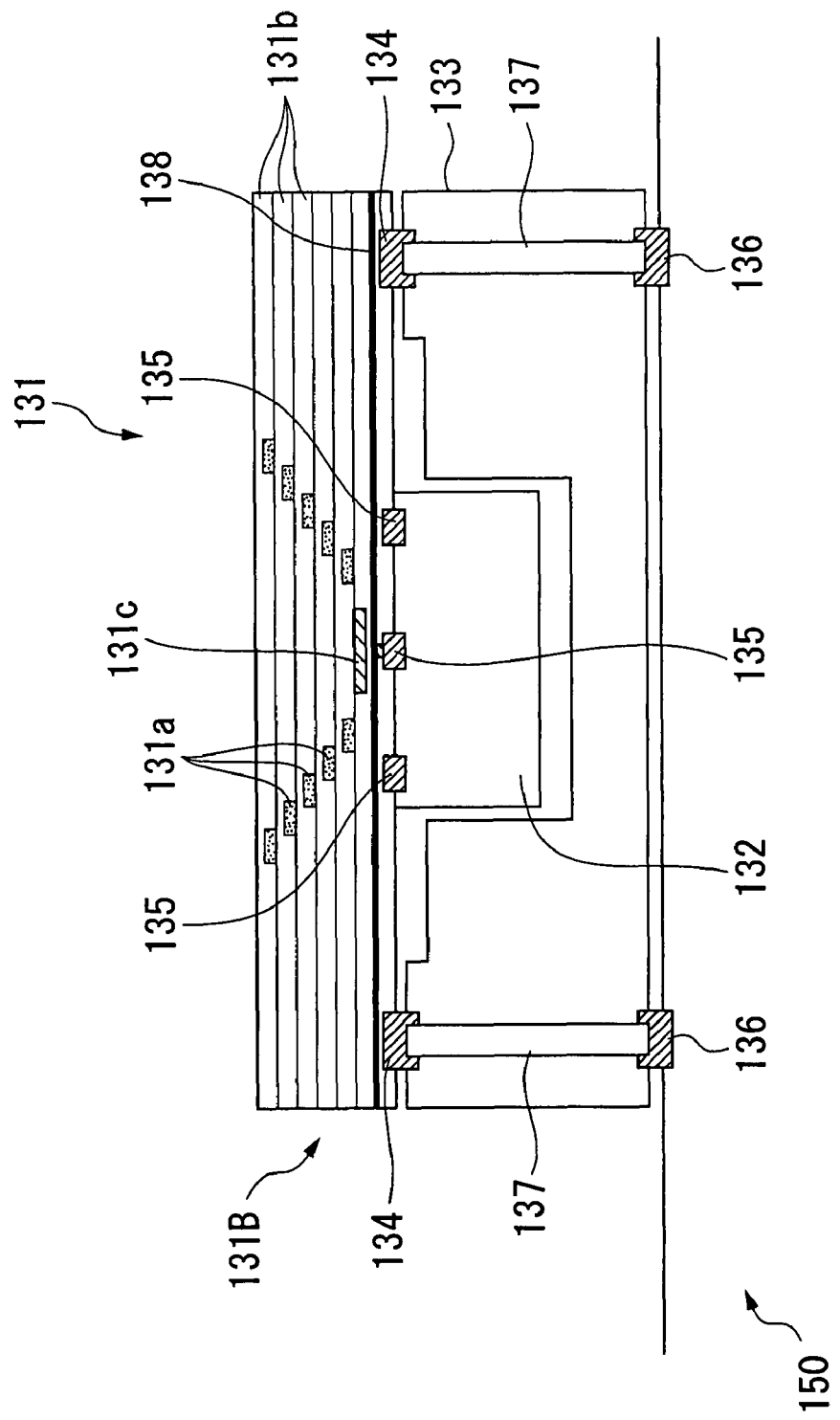
FIG. 25 is a diagram showing the construction of a system-on-package according to a fourteenth embodiment of the present invention.

An RF package according to a fourteenth embodiment of the present invention is described while referring to FIG. 25. In the thirteenth embodiment (FIG. 24), an example was shown in which the feeding element 131c was mounted on the MMIC 132, whereas in the present embodiment, the feeding element 131c is provided on the antenna device 131 side. Also, a bump 135 is provided at the position where the feeding element 131c was disposed in FIG. 24. Moreover, a ground was not shown in FIG. 24, whereas in the present embodiment, a ground 138 is explicitly shown disposed in the layer below the feeding element 131c. It should be noted that the parasitic element 131d shown in FIG. 24 is not shown in the present embodiment. Other features of the construction are the same as those shown in FIG. 24.

Fifteenth Embodiment

Figure 26:
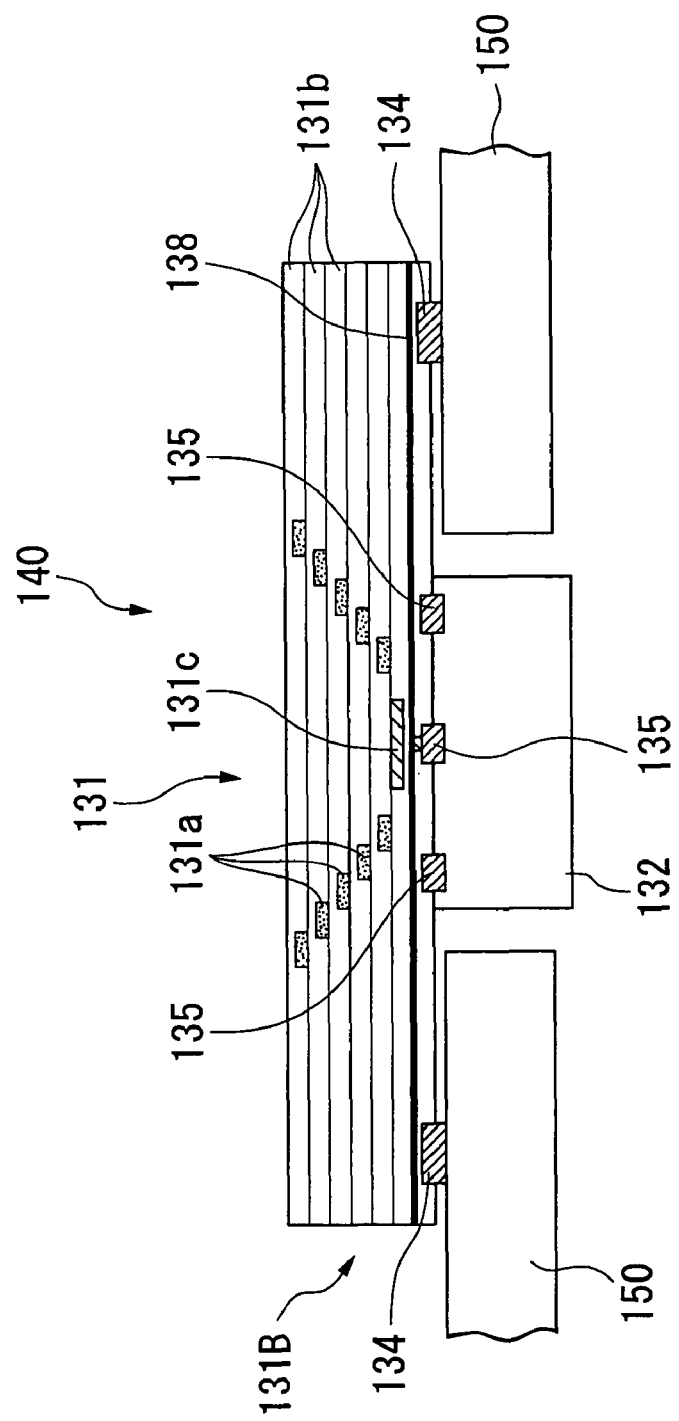
FIG. 26 is a diagram showing the construction of a module according to a fifteenth embodiment of the present invention.

A module according to a fifteenth embodiment of the present invention is described while referring to FIG. 26. Instead of an RF package 130 as in the fourteenth embodiment, the present embodiment features a module 140 in which an MMIC 132 is mounted on the surface of an antenna device 131. It should be noted that as used herein, "the surface of the antenna device" refers to the bottom surface of an antenna device 131 provided with terminals for obtaining electrical contact with terminals provided on a motherboard 150. Therefore, in the present embodiment, the holding member 133, bumps 136, and via holes 137 shown in FIG. 25 are absent.

In the present embodiment, an opening that allows the MMIC 132 to be inserted is formed in the motherboard 150. Terminals provided on the bottom surface of the antenna device 131 and terminals provided on the motherboard 150 are electrically connected by bumps 134, and the antenna device 131 is supported by the bumps 134.

In the constructions shown in FIGS. 24 and 25, via holes 137 account for most of the loss in the millimeter wave frequency band. By contrast, in the present embodiment, direct contact is achieved with bumps 134, eliminating the need to provide via holes. As a result, losses when connecting the antenna device 131 and the motherboard 150 can be dramatically reduced.

Sixteenth Embodiment

Figure 27:
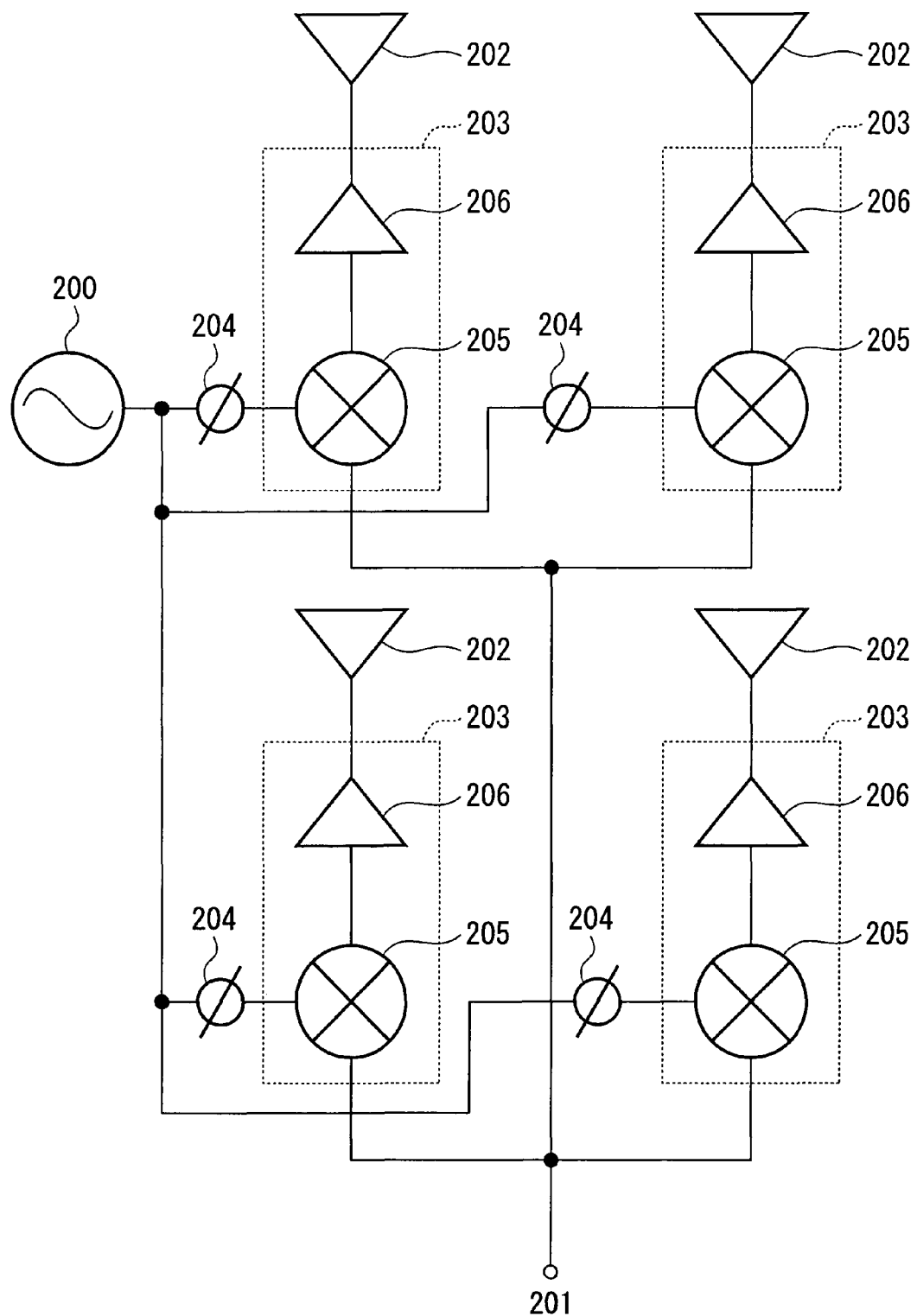
FIG. 27 is a diagram showing the construction of a module array according to a sixteenth embodiment of the present invention.

A module array according to a sixteenth embodiment of the present invention is described while referring to FIG. 27. FIG.

27 is a block diagram showing the electrical configuration for a module array in which four modules according to the fifteenth embodiment (FIG. 26) are provided. In FIG. 27, 200 denotes a local oscillator which is the source of oscillation for the microstrip antennas, 201 denotes an intermediate frequency (IF) signal input terminal, 202 denotes antennas which correspond to the antenna devices in the above-described embodiments, 203 denotes RF circuits, 204 denotes phase shifters, 205 denotes frequency mixers, and 206 denotes amplifiers for reducing noise and loss. A frequency mixer 205 and an amplifier 206 together make up an RF circuit 203. An antenna 202 and an RF circuit 203 together make up a module.

Oscillating signals generated by the local oscillator 200 are input to the phase shifter 204 provided for each module. The phase shifter 204 individually adjusts the phases of the oscillating signals, thereby individually controlling the phases of the electromagnetic waves radiated from the antenna 202 of each module. The frequency mixer 205 mixes the common IF signals input from the IF signal input terminal 201 and the output from the phase shifter 204. The amplifier 206 amplifies the mixed signals and feeds the resultant signals to the antenna 202. By employing such a configuration, phase adjustment using the phase shifter 204 is carried out, enabling the radiation characteristics of the beam to be controlled.

Seventeenth Embodiment

Figure 28:
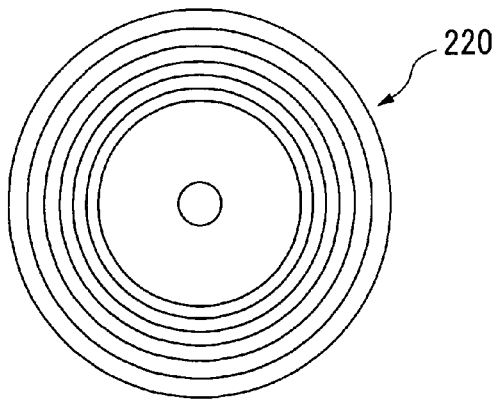
FIG. 28 is a plan view of a single-element antenna.

The above-described embodiments all relate to a single-element antenna 220 like that shown in FIG. 28. However, by providing a plurality of such single-element antennas 220 in the form of an array antenna, an even higher gain can be achieved. For example, a high gain is required in an automotive collision-avoidance radar system, but achieving such a high gain is difficult using a single-element antenna. Yet, when four single-element antennas are provided in the form of an array antenna, an improvement in gain of 6 dBi is achieved. Hence, by using high-gain antennas such as the antenna devices according to the above-described embodiments as the individual single-element antennas making up the array antenna, the antenna devices can be adapted for use in applications such as automotive collision-avoidance radar systems.

Figure 29:
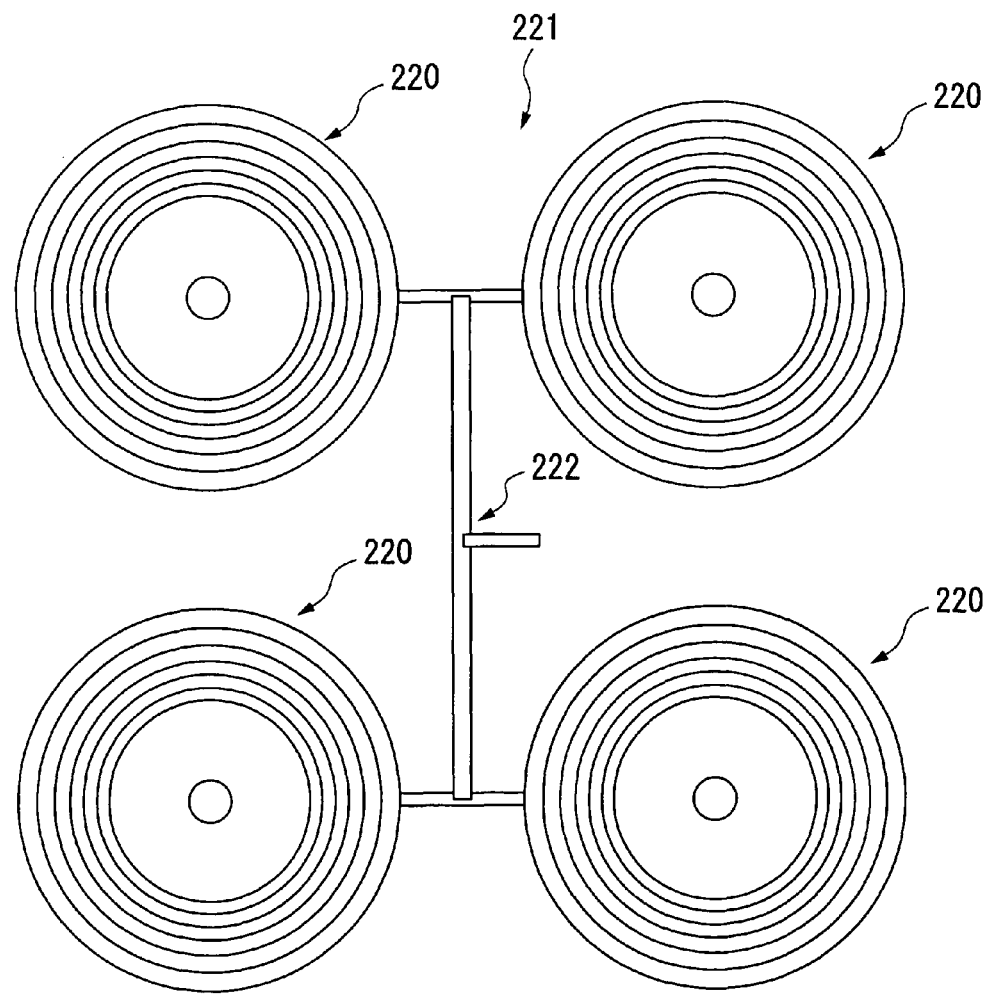
FIG. 29 is a plan view showing the construction of a four-element array antenna according to a seventeenth embodiment of the present invention.
Figure 30A:
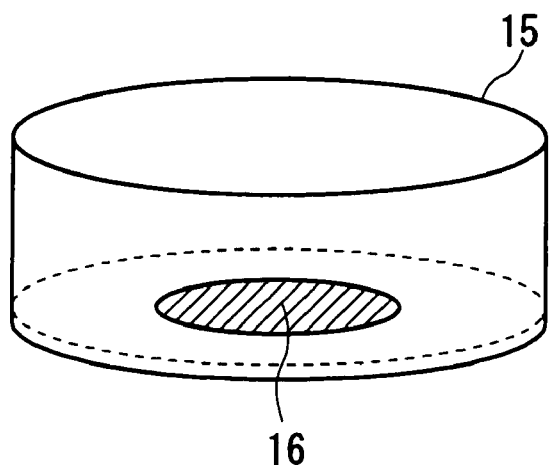
FIG. 30A is a perspective view showing an example of the construction of a conventional antenna device.
Figure 30B:
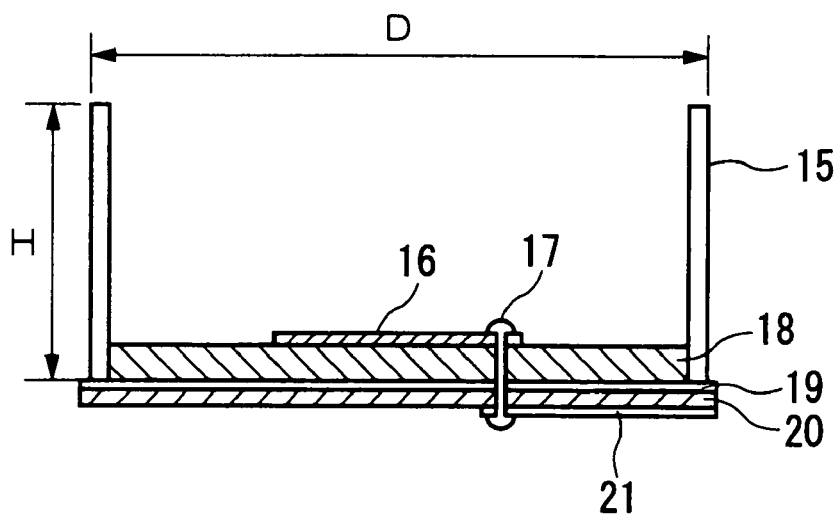
FIG. 30B is a cross-sectional view showing an example of the construction of a conventional antenna device.

FIG. 29 shows an example of a four-element array antenna 221 configuration in which four single-element antennas 220 are provided as the elements. The four single-element antennas 220 are positioned on the same plane, and the single-element antennas 220 are electrically connected with a feeder line 222.

Preferred embodiments of the present invention have been described above. However, the present invention is not limited to these embodiments, and various design modifications are possible insofar as they do not depart from the scope of the claims.

For example, the respective embodiments described above are directed to cases involving the parasitic element driven in a third order mode. However, the present invention is not limited to such cases. Instead of parasitic elements which are driven in a third order mode, parasitic elements with a shape and dimensions that are driven in a fifth or higher order odd mode may be employed in the tenth to twelfth embodiments.

INDUSTRIAL APPLICABILITY

The present invention is used for achieving higher gain antennas using chip antennas or the like. In particular, it is useful for attaining a high gain in connection with system-on-package technology. The present invention is based on the fact that loss due to the connection interface between an antenna and an RF circuit is not negligible. By integrating a substrate having a built-in RF circuit with an antenna substrate and also incorporating a surface antenna in the form of a chip, the present invention achieves antenna devices having a small size and a high gain. The present invention also provides array antenna devices, modules, module arrays, and package modules which use such antenna devices.

The invention claimed is:
1. An antenna device comprising:
a multilayer dielectric substrate composed of a combination of a plurality of dielectric layers;
a feeding antenna provided in a lower layer of the multilayer dielectric substrate;
a metal plate provided above the feeding antenna;
circular or rectangular metal loops arranged in the plurality of dielectric layers so as to be of increasing diameter from lower layers toward upper layers; and
a MEMS device which functions as a reflector on a back surface of the metal plate,
wherein the metal plate functions as a primary reflector and the metal loops function as secondary reflectors.

2. The antenna device as recited in claim 1, wherein a circular or rectangular slot is formed in the metal plate.

3. The antenna device as recited in claim 1, further comprising a planar antenna provided on a bottom surface of the metal plate, wherein the planar antenna has a stub on a surface of the planar antenna.

4. The antenna device as recited in claim 3, wherein the planar antenna comprises a variable capacitance element as an element.

5. The antenna device as recited in claim 1, wherein a plurality of sets of the metal loops which function as secondary reflectors corresponding to a plurality of frequencies are arranged in the plurality of dielectric layers.

6. The antenna device as recited in claim 1, wherein the feeding antenna is constructed of a single feeding element, a single feeding element in combination with one or more parasitic element, a plurality of feeding elements, or a plurality of element groups each having a single feeding element and one or more parasitic element.

7. The antenna device as recited in claim 1, wherein the metal plate functions as a parasitic element and the metal loops function as reflectors.

8. The antenna device as recited in claim 7, wherein the shape of the metal plate is a circle or a rectangle, with the diameter of the circle or the length of any one side of the rectangle being in a range of from 1.48 times to 2.16 times the wavelength in a dielectric of the multilayer dielectric substrate.

9. The antenna device as recited in claim 7, wherein the shape of the metal plate is a circle or a rectangle, with the diameter of the circle or the length of any one side of the rectangle being in a range of from 1.62 times to 1.86 times the wavelength in a dielectric of the multilayer dielectric substrate.

10. The antenna device as recited in claim 7, wherein the metal plate is made of a metal that is driven in a fifth or higher order odd mode.

11. The antenna device as recited in claim 7, wherein the metal plate has a height from the bottommost dielectric layer in a range of from 0.12 to 0.28 times the wavelength in a dielectric of the multilayer dielectric substrate.

12. The antenna device as recited in claim 7, wherein the metal plate has a height from the bottommost dielectric layer in a range of from 0.16 to 0.22 times the wavelength in a dielectric of the multilayer dielectric substrate.

13. The antenna device as recited in claim 1, wherein the metal loops have a construction in which a sector having an arbitrary angle has been removed from an overall circumference.

14. The antenna device as recited in claim 1, wherein the metal loops arranged in respective layers of the plurality of dielectric layers are connected by through holes or via holes.

15. The antenna device as recited in claim 1, wherein the metal plate is a microstrip antenna which resonates at a second frequency and is driven at the second frequency independent of the feeding antenna which is driven at a first frequency.

16. A module comprising: the antenna device as recited in claim 1; and an active device mounted on a surface of the antenna device.

17. A module array, comprising a plurality of modules as recited in claim 16.

18. A package module, comprising: the antenna device as recited in claim 1; an active device mounted on a surface of the antenna device; and a substrate having a cavity structure and being connected to the antenna device on a side of the surface.

19. An array antenna device, comprising a plurality of antenna devices as recited in claim 1.

* * * * *